(12) United States Patent
Sakai et al.

(10) Patent No.: US 9,135,989 B2
(45) Date of Patent: Sep. 15, 2015

(54) WRITE DATA PRESERVATION FOR NON-VOLATILE STORAGE

(75) Inventors: Manabu Sakai, Yokohama (JP); Toru Miwa, Yokohama (JP); Tien-chien Kuo, Sunnyvale, CA (US)

(73) Assignee: SanDisk Technologies Inc., Plano, TX (US)

( * ) Notice: Subject to any disclaimer, the term of this patent is extended or adjusted under 35 U.S.C. 154(b) by 499 days.

(21) Appl. No.: 13/605,583

(22) Filed: Sep. 6, 2012

(65) Prior Publication Data

US 2014/0063961 A1 Mar. 6, 2014

(51) Int. Cl.
*G11C 11/34* (2006.01)
*G11C 11/56* (2006.01)

(52) U.S. Cl.
CPC .... *G11C 11/5628* (2013.01); *G11C 2211/5621* (2013.01)

(58) Field of Classification Search
USPC ............ 365/185.03, 185.04, 185.09, 185.12, 365/185.17, 185.18, 185.22, 185.24, 185.33
See application file for complete search history.

(56) References Cited

U.S. PATENT DOCUMENTS

| | | | |
|---|---|---|---|
| 6,914,823 B2 | 7/2005 | Chen et al. | |
| 6,917,542 B2 | 7/2005 | Chen et al. | |
| 7,117,296 B2 | 10/2006 | Hosono et al. | |
| 7,206,230 B2 | 4/2007 | Li et al. | |
| 7,345,928 B2 * | 3/2008 | Li | 365/185.22 |
| 7,420,847 B2 * | 9/2008 | Li | 365/185.09 |
| 7,502,260 B2 | 3/2009 | Li | |
| 7,508,721 B2 | 3/2009 | Li et al. | |
| 7,652,918 B2 * | 1/2010 | Wan et al. | 365/185.03 |
| 8,218,366 B2 * | 7/2012 | Dong et al. | 365/185.22 |
| 2009/0262578 A1 | 10/2009 | Li et al. | |
| 2011/0182121 A1 | 7/2011 | Dutta et al. | |

FOREIGN PATENT DOCUMENTS

WO 2006107651 A1 10/2006

OTHER PUBLICATIONS

International Search Report and Written Opinion dated Oct. 28, 2013, PCT Patent Application No. PCT/US2013/044846, filed Jun. 7, 2013, 7 pages.

* cited by examiner

*Primary Examiner* — Trong Phan
(74) *Attorney, Agent, or Firm* — Vierra Magen Marcus LLP

(57) ABSTRACT

Methods and non-volatile storage systems are provided for recovering data during a programming of non-volatile storage. Program data that was originally stored in one set of latches may be preserved with a combination of two sets of latches. These two sets of latches may also be used to store verify status during programming of that program data. The original program data may be recovered by performing a logical operation on the data in the two sets of latches. For example, upper page data could be initially stored in one set of latches. While the upper page data is being programmed, that set of latches and another set of latches are used to store verify status with respect to the upper page data. If a program error occurs while the upper page data is being preserved, it may be recovered by performing a logical operation on the two sets of latches.

31 Claims, 29 Drawing Sheets

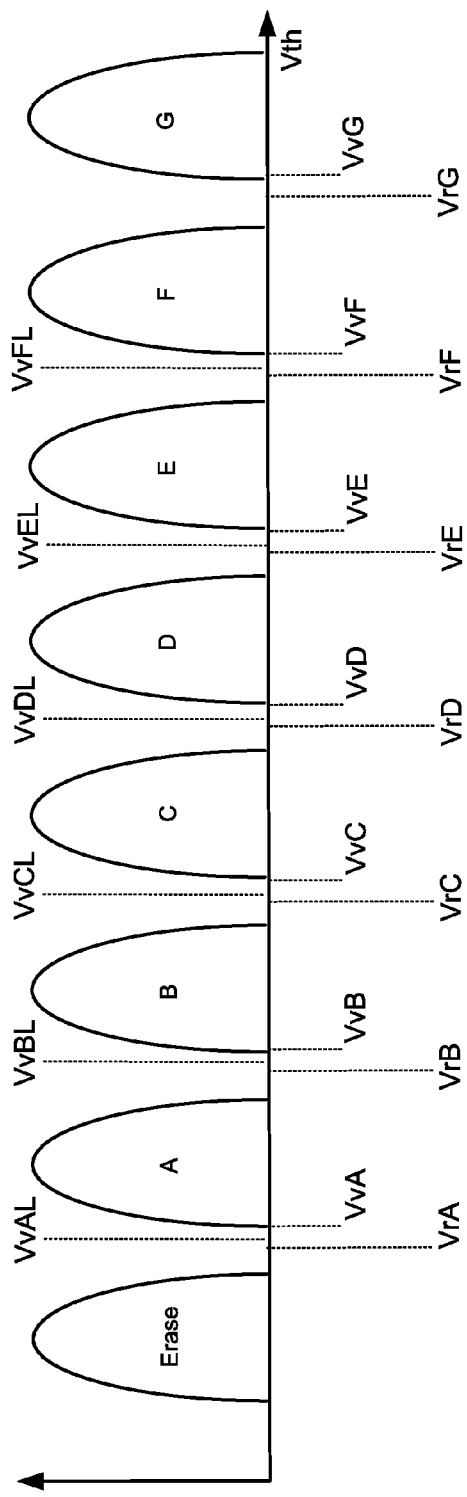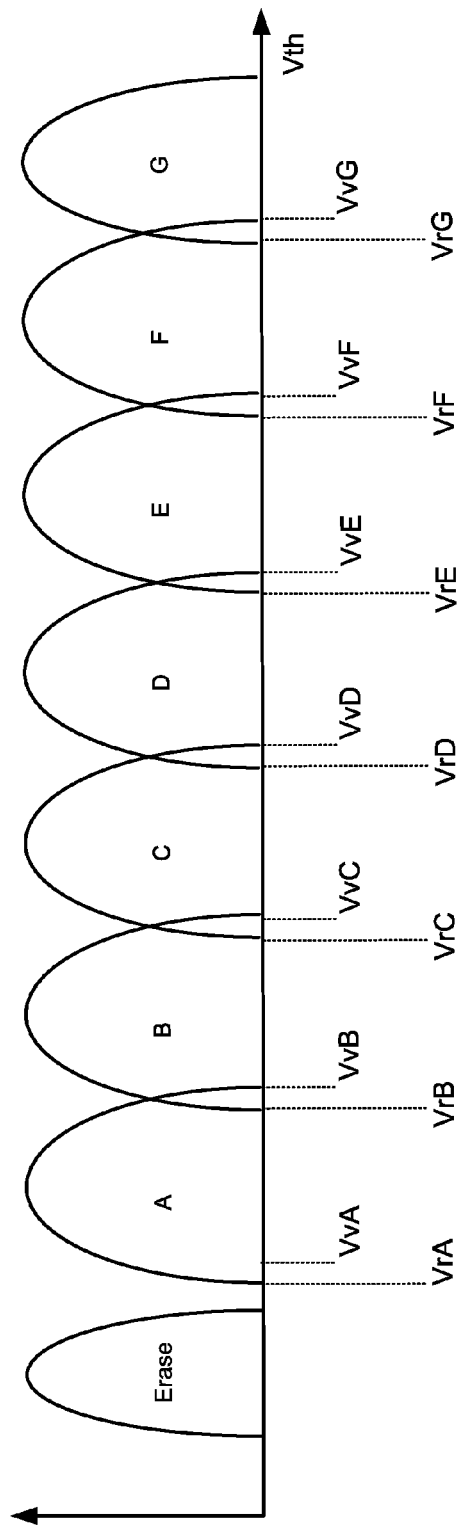
Fig. 5A
Fig. 5B

First programming pass

Second programming pass

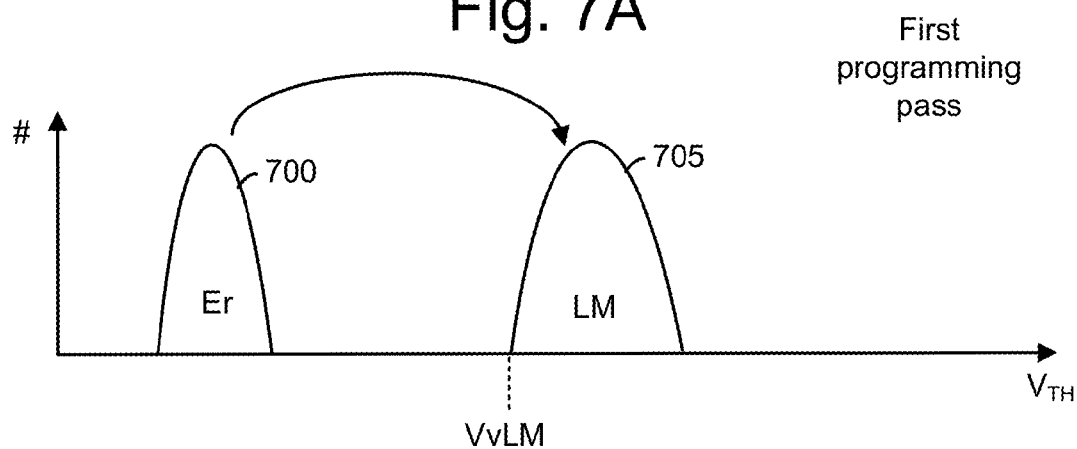
Fig. 7A — First programming pass
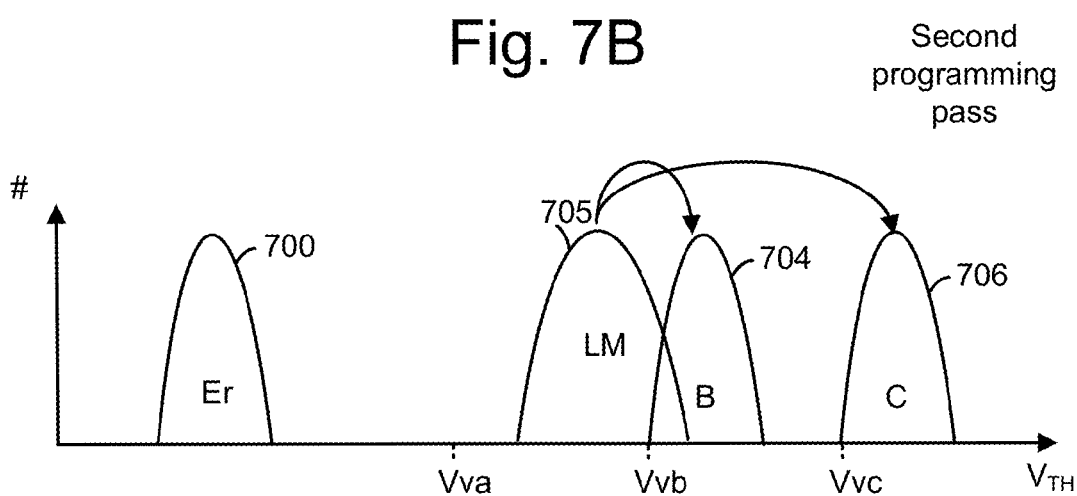
Fig. 7B — Second programming pass
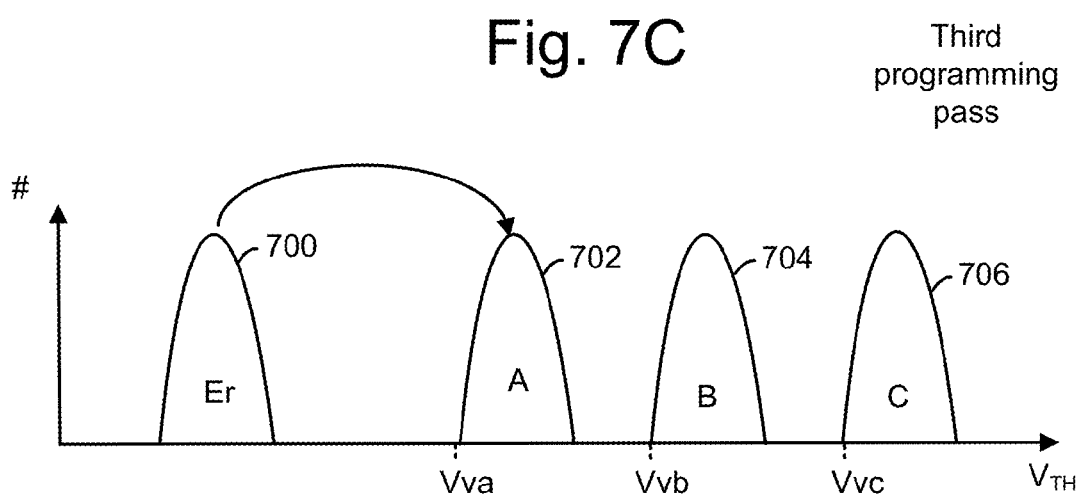
Fig. 7C — Third programming pass

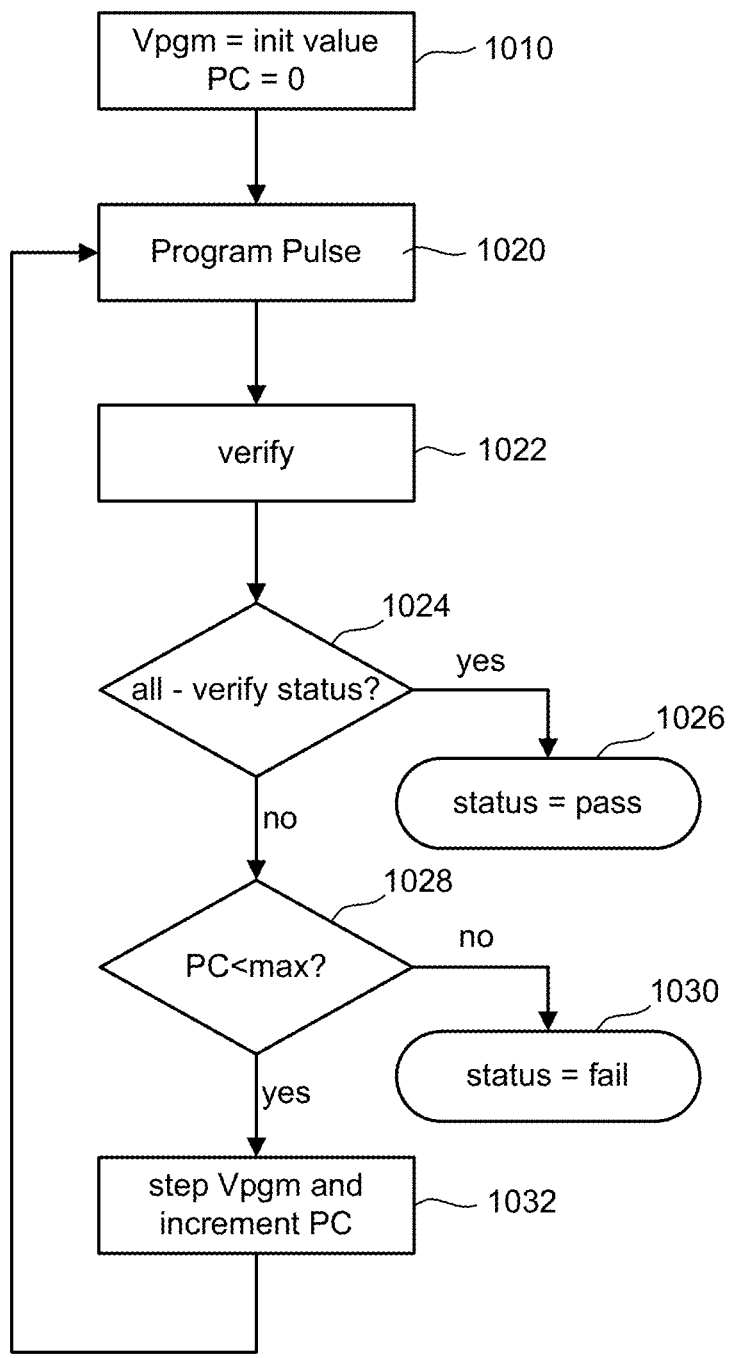

| State | Er-cell Inhibit | A-cell Inhibit | B-cell Program | C-cell Program |
|---|---|---|---|---|
| DL1 | 1 | 1 | 0 | 0 |
| DL2 | 1 | 0 | 0 | 1 |
| DL3 | - | - | - | - |

Fig. 13C

| State | Er-cell Inhibit | A-cell Inhibit | B-cell Program | C-cell Program |
|---|---|---|---|---|
| DL1 | 1 | 1 | 0 | 0 |
| DL2 | 1 | 0 | 0 | 1 |
| DL3 | 1 | 0 | 0 | 0 |

Fig. 13D

| State | Er-cell Inhibit | A-cell Inhibit | B-cell Program | B-cell QPW | B-cell Inhibit | C-cell Program | C-cell QPW | C-cell Inhibit |
|---|---|---|---|---|---|---|---|---|
| DL1 | 1 | 1 | 0 | 0 | 1 | 0 | 0 | 1 |
| DL2 | 1 | 0 | 0 | 0 | 0 | 1 | 1 | 1 |
| DL3 | 1 | 0 | 0 | 1 | 1 | 0 | 1 | 1 |

Fig. 13G

| State | Er-cell Inhibit | A-cell Inhibit | B-cell Program | B-cell QPW | B-cell Inhibit | C-cell Program | C-cell QPW | C-cell Inhibit |
|---|---|---|---|---|---|---|---|---|
| DL1 | 1 | 1 | 0 | 0 | 1 | 0 | 0 | 1 |
| DL2 | 1 | 0 | 0 | 0 | 0 | 1 | 1 | 1 |
| DL3 | 0 | 0 | 0 | 1 | 1 | 0 | 1 | 0 |

Fig. 13H

| State | Er-cell Inhibit | A-cell Program | B-cell Inhibit | C-cell Inhibit |
|---|---|---|---|---|
| DL1 | available | | | |
| DL2 | 1 | 0 | 1 | 1 |
| DL3 | 0 | 0 | 1 | 0 |

Fig. 13I

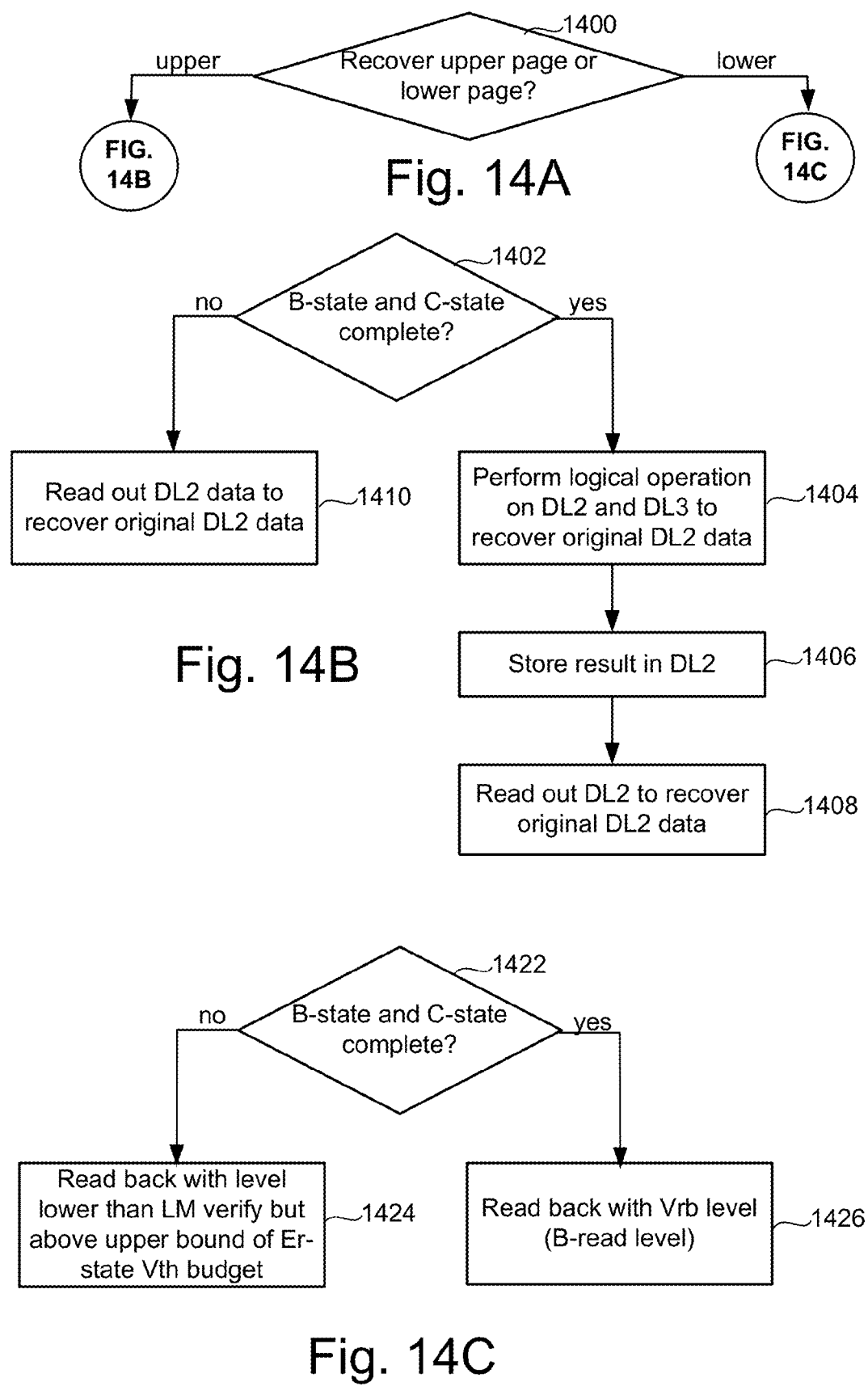

| State | Er-cell Inhibit | A-cell Inhibit | B-cell Program | C-cell Program |
|---|---|---|---|---|
| DL1 | 1 | 1 | 0 | 0 |
| DL2 | 1 | 0 | 0 | 1 |
| DL3 | - | - | - | - |

| State | Er-cell Inhibit | A-cell Inhibit | B-cell Program | C-cell Program |
|---|---|---|---|---|
| DL1 | 1 | 1 | 0 | 0 |
| DL2 | 1 | 0 | 0 | 1 |
| DL3 | 1 | 1 | 1 | 0 |

| State | Er-cell Inhibit | A-cell Inhibit | B-cell Inhibit | C-cell Program | C-cell QPW | Inhibit |
|---|---|---|---|---|---|---|
| DL1 | 1 | 1 | 0 | 0 | 1 | 1 |
| DL2 | 1 | 0 | 0 | 1 | 1 | 1 |
| DL3 | 1 | 1 | 1 | 0 | 0 | 1 |

Fig. 16E

| State | Er-cell Inhibit | A-cell Inhibit | B-cell Inhibit | C-cell Inhibit |
|---|---|---|---|---|
| DL1 | 1 | 1 | 0 | 1 |
| DL2 | 1 | 0 | 0 | 1 |
| DL3 | 1 | 1 | 1 | 1 |

Fig. 16F

| State | Er-cell Inhibit | A-cell Inhibit | B-cell Inhibit | C-cell Inhibit |
|---|---|---|---|---|
| DL1 | 1 | 1 | 0 | 1 |
| DL2 | 1 | 0 | 0 | 1 |
| DL3 | 0 | 0 | 0 | 0 |

| State | Er-cell Inhibit | A-cell Program | A-cell QPW | A-cell Inhibit | B-cell Program | B-cell QPW | B-cell Inhibit | C-cell Inhibit |
|---|---|---|---|---|---|---|---|---|
| DL1 | 1 | 1 | 1 | 1 | 0 | 0 | 0 | 1 |
| DL2 | 1 | 0 | 0 | 1 | 0 | 0 | 1 | 1 |
| DL3 | 0 | 0 | 1 | 1 | 0 | 1 | 1 | 0 |

Fig. 16I

| State | Er-cell Inhibit | A-cell Program | A-cell QPW | A-cell Inhibit | B-cell Program | B-cell QPW | B-cell Inhibit | C-cell Inhibit |
|---|---|---|---|---|---|---|---|---|
| DL1 | | | | | | | | |
| DL2 | 1 | 0 | 0 | 1 | 0 | 0 | 1 | 1 |
| DL3 | 0 | 0 | 1 | 1 | 0 | 1 | 1 | 0 |

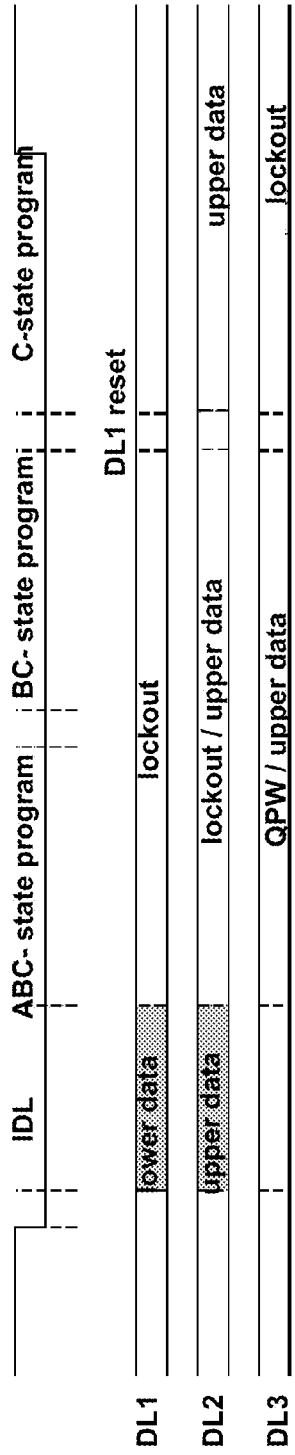

| State | Er-cell Inhibit | A-cell Program | A-cell QPW | A-cell Inhibit | B-cell Program | B-cell QPW | B-cell Inhibit | C-cell Program | C-cell Inhibit |
|---|---|---|---|---|---|---|---|---|---|
| DL1 | 1 | 1 | 1 | 1 | 0 | 0 | 1 | 0 | 1 |
| DL2 | 1 | 0 | 0 | 1 | 0 | 0 | 1 | 1 | 1 |
| DL3 | 0 | 0 | 1 | 1 | 0 | 1 | 1 | 0 | 0 |

Fig. 18E

| State | Er-cell Inhibit | A-cell Program | A-cell QPW | A-cell Inhibit | B-cell Program | B-cell QPW | B-cell Inhibit | C-cell Program | C-cell Inhibit |
|---|---|---|---|---|---|---|---|---|---|
| DL1 | 1 | 1 | 1 | 1 | 0 | 0 | 1 | 0 | 1 |
| DL2 | 1 | 0 | 0 | 1 | 0 | 0 | 1 | 1 | 1 |
| DL3 | 0 | 0 | 1 | 1 | 0 | 1 | 1 | 0 | 0 |

Fig. 18F

| State | Er-cell Inhibit | A-cell Inhibit | B-cell Inhibit | C-cell Program | C-cell Inhibit |
|---|---|---|---|---|---|
| DL1 | 1 | 1 | 1 | 0 | 1 |
| DL2 | 1 | 1 | 1 | 1 | 1 |
| DL3 | 0 | 1 | 1 | 0 | 0 |

Fig. 18G

| State | Er-cell Inhibit | A-cell Inhibit | B-cell Inhibit | C-cell Program | C-cell Inhibit |
|---|---|---|---|---|---|
| DL1 | 1 | 1 | 1 | 0 | 1 |
| DL2 | 1 | 0 | 0 | 1 | 1 |
| DL3 | 0 | 1 | 1 | 0 | 0 |

Fig. 18H

| State | Er-cell Inhibit | A-cell Inhibit | B-cell Inhibit | C-cell Program | C-cell Inhibit |
|---|---|---|---|---|---|
| DL1 |   |   |   |   |   |
| DL2 | 1 | 0 | 0 | 1 | 1 |
| DL3 | 1 | 1 | 1 | 0 | 1 |

Fig. 18I

WRITE DATA PRESERVATION FOR NON-VOLATILE STORAGE

BACKGROUND

The present disclosure relates to technology for non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM. The array of storage elements may be divided into a large number of blocks of storage elements.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate. Thus, a storage element may be read by applying a reference voltage to it control gate and sensing the magnitude of the current that flows between its drain and source.

A storage element may be programmed by applying suitable programming voltages to its control gate. Typically, a program voltage Vpgm applied to the control gate during a program operation is applied as a series of pulses that increase in magnitude over time. The threshold voltage (Vth) of the transistor in the storage element is measured after each program pulse to determine whether the storage element is programmed. When a given storage element passes verify, it is locked out from further programming.

Some devices have a memory controller included in the same memory device as one or more memory die. Commands and data are transferred between the controller and the one or more memory die. For some conventional techniques, the data to be programmed into the storage elements on a memory die is first stored into data latches on the memory die.

However, during programming, the data in the data latches is lost with some conventional techniques. As one example, the verify status for a given storage element is recorded in one of the latches that the program data was originally stored into. However, this means that the original program data is lost during the programming process. Thus, if a program error occurs, the original program data cannot be recovered from the data latches for some conventional techniques.

One possible recovery mode is for the controller to save the program data while the programming is underway. Thus, the controller can re-program the data to other storage elements after a program failure. However, this recovery mode occupies controller storage (e.g., data latches). Thus, the controller cannot release this storage before the programming is finished.

Another possible approach for data recovery is for the controller to first buffer the program data in a cache area on the memory die. This cache area may be storage elements that are intended for short term data storage. However, there is a performance penalty to program the data to the cache area prior to every program operation. Also, the data from the cache storage elements needs to be read back and error-bit correction (ECC) is also needed in this approach.

BRIEF SUMMARY OF THE INVENTION

One embodiment includes a method for operating non-volatile storage in which data is recovered. A plurality of first bits are stored into a corresponding plurality of first latches. A plurality of second bits are stored into a corresponding plurality of second latches. The plurality of first bits and the plurality of second bits are programmed into a plurality of non-volatile storage elements. Each of the non-volatile storage elements is to be programmed with one of the plurality of first bits and one of the plurality of second bits. The plurality of second latches and a plurality of third latches are used for verify status when programming the non-volatile storage elements. The plurality of second bits are preserved within a combination of the plurality of second latches and the plurality of third latches while using the plurality of second latches and the plurality of third latches for verify status. The plurality of second bits are recovered in response to a program error during the programming. The recovering is based on data in at least the plurality of second latches.

BRIEF DESCRIPTION OF THE DRAWINGS

FIG. 5A depicts an example set of threshold voltage distributions for an eight-state memory device in which each storage element stores three bits of data.

FIG. 5B illustrates that Vt distributions can partially overlap.

FIGS. 7A, 7B, and 7C depict one embodiment of a three pass programming sequence in accordance with one embodiment.

FIG. 10 is a flowchart describing one embodiment of a programming process, which includes one or more verification steps.

FIG. 13C shows target data stored in the DL1 and DL2 latches during one embodiment of programming.

FIG. 13D shows a table of one embodiment of initial states of the DL1, DL2 and DL3 latches for memory cells targeted for various states.

FIG. 13G shows a table of one embodiment of the state of the latches at the end of C-state programming.

FIG. 13H shows one embodiment of a first conversion step for preserving program data.

FIG. 13I shows one embodiment of a second conversion step for preserving program data.

FIG. 14A is a flowchart of one embodiment of a process of recovering program data.

FIG. 14B shows one embodiment of a data recovery process in which upper page data is recovered.

FIG. 14C shows one embodiment of a data recovery process in which lower page data is recovered.

FIG. 16E shows a table of one embodiment of latch use during the C-state programming during the process of FIG. 16A.

FIG. 16F shows a table of one embodiment of the state of the latches at the end of C-state programming.

FIG. 16G shows one embodiment of setting DL3 latches during the process of FIG. 16A.

FIG. 16H shows a table of the eight possible states during one embodiment of the AB-state stage of programming.

FIG. 16I shows a table of the six possible states during one embodiment of the B-state stage of programming.

FIG. 18B is a diagram that shows latch usage during one embodiment of the process of FIG. 18A.

FIG. 18C shows target data stored in the DL1 and DL2 latches.

FIG. 18D shows a table of initial states of the DL1, DL2 and DL3 latches for memory cells targeted for various states for one embodiment of the process of FIG. 18A.

FIG. 18E shows a table of latch use during one embodiment of ABC-state programming in which there are nine possible states.

FIG. 18F shows a table of the latch usage during one embodiment of the BC-state program stage.

FIG. 18G shows the state of the latches after one embodiment of the BC-state program stage.

FIG. 18H shows one embodiment of conversion of data in the DL2 latches.

FIG. 18I shows one embodiment of conversion of data in the DL3 latches.

DETAILED DESCRIPTION

Figure 1A:
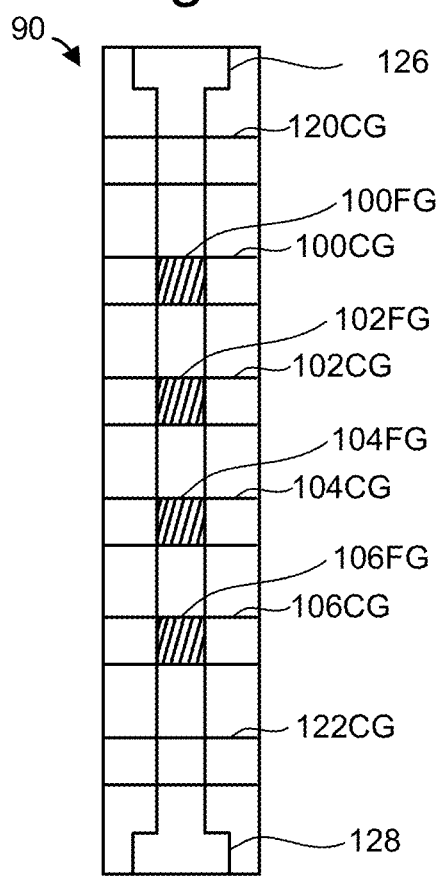
FIG. 1A is a top view of one embodiment of a NAND string.

Methods and non-volatile storage systems are provided for recovering data during a programming of non-volatile storage. As noted above, in some conventional programming techniques, data to be written to non-volatile storage elements could be temporarily stored in latches or the like. The latches might be freed or the data in the latches could be overwritten during programming. Therefore, if an error occurs during programming, the original data stored in the latches is not available for recovery purposes, with some conventional techniques.

Techniques are disclosed for recovering program data from latches in the event that an error occurs during programming. In one embodiment, data that is to be written to non-volatile storage elements is stored in latches prior to programming. For example, data could be stored in a first latch and a second latch associated with each non-volatile storage element. As one example, collectively the first latch for each non-volatile storage element stores a first page of data, and collectively the second latch for each non-volatile storage element stores a second page of data. In one embodiment, the second page of data is recovered in the event of a program error. In one embodiment, both the first page and the second page of data are recovered in the event of a program error.

The latches may be used to store verify status during programming. In one embodiment, at least the second latch and a third latch are used to store verify status. The first latch might also be used to store verify status. Storing verify status involves testing whether a storage element has been programmed to its intended state, and using the latch to indicate whether or not the intended state has been reached. Therefore, the data in the latch could potentially change during programming. However, the data in the latches may be converted during programming in order to preserve the original program data. The original program data from the second latches may be stored in some combination of the second and third latches. In the event of a program error, the program data originally stored in the second latches may be recovered based on data at least in the second latches.

In one embodiment, program data that was originally stored in one set of latches may be preserved with a combination of two sets of latches. These two sets of latches may also be used to store verify status during programming of that program data. The original program data may be recovered by performing a logical operation on the data in the two sets of latches. For example, upper page data could be initially stored in one set of latches. While the upper page data is being programmed, that set of latches and another set of latches are used to store verify status with respect to the upper page data. If a program error occurs while the upper page data is being preserved, it may be recovered by performing a logical operation on the two sets of latches.

The data recovery may depend upon when the program error occurred, as well as what type of programming sequence was used. In one embodiment, the upper page is preserved in a combination of the second latches and the third latches while using the second latches and the third latches for verify status. Note that the upper page might be entirely recoverable from the second latches during a portion of the programming sequence. Thus, the data might be recovered by applying a logical operation to the second and third latches based on whether the program error occurred while the program data was being preserved in the combination of the second latches and the third latches.

In one embodiment, to preserve the program data in the combination of the second latches and the third latches a data conversion step is performed. For example, data stored in the second and/or third latches may be changed at some pre-determined point in the programming sequence to preserve the program data. The pre-determined point may be the completion of a programming a particular program state.

In one embodiment, the data is recovered by applying a logical operation to the second and third latches if the program error occurred after converting the data in the second latches and the third latches. Further details are discussed herein of various programming sequences, which may impact how data recovery is performed, as well as how the data is converted in the second and third latches during programming. Embodiments are not limited to the various example programming sequences described herein.

The first latches are released prior to completion of programming, in some embodiments. In one embodiment, the first latches are free while preserving the program data within a combination of the second latches and the third latches. By being "free" it is meant that the latches are not used for storing program data or verify status. These first latches may then be used for purposes such as background caching. For example, the first latches may be used for some other purpose as programming is still to be completed.

Figure 1B:
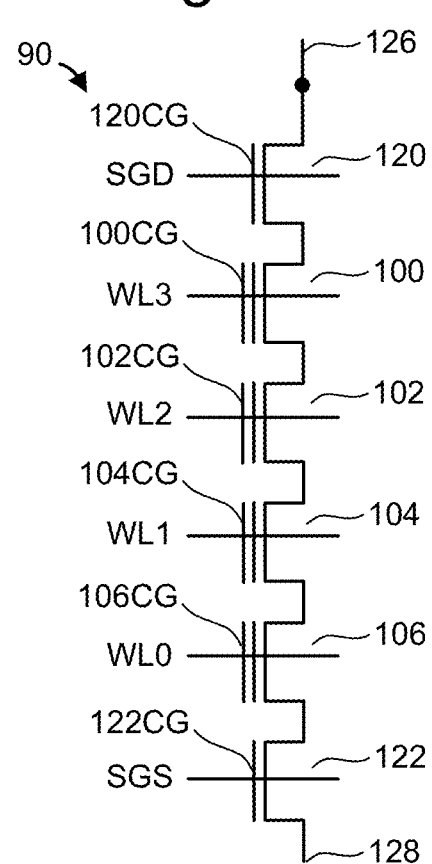
FIG. 1B is an equivalent circuit diagram of the NAND string.

One example of a suitable memory system for implementing embodiments uses the NAND flash memory structure, which arranges multiple transistors in series between two select gates. The transistors in series and the select gates are referred to as a NAND string. FIG. 1A is a top view showing one NAND string 90. FIG. 1B is an equivalent circuit thereof. The NAND string depicted includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gates 120 and 122 are controlled by applying the appropriate voltages to control gates 120CG and 122CG, respectively. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gates 100CG, 102CG, 104CG and 106CG are connected to word lines WL3, WL2, WL1 and WL0, respectively. In one embodiment, transistors 100, 102, 104 and 106 are each memory cells. In other embodiments, the memory cells may include multiple transistors or may be different than that depicted. Select gates 120 and 122 are connected to drain-side select line SGD and source-side select line SGS, respectively. Other types of non-volatile memory in addition to NAND flash memory can also be used.

Figure 2:
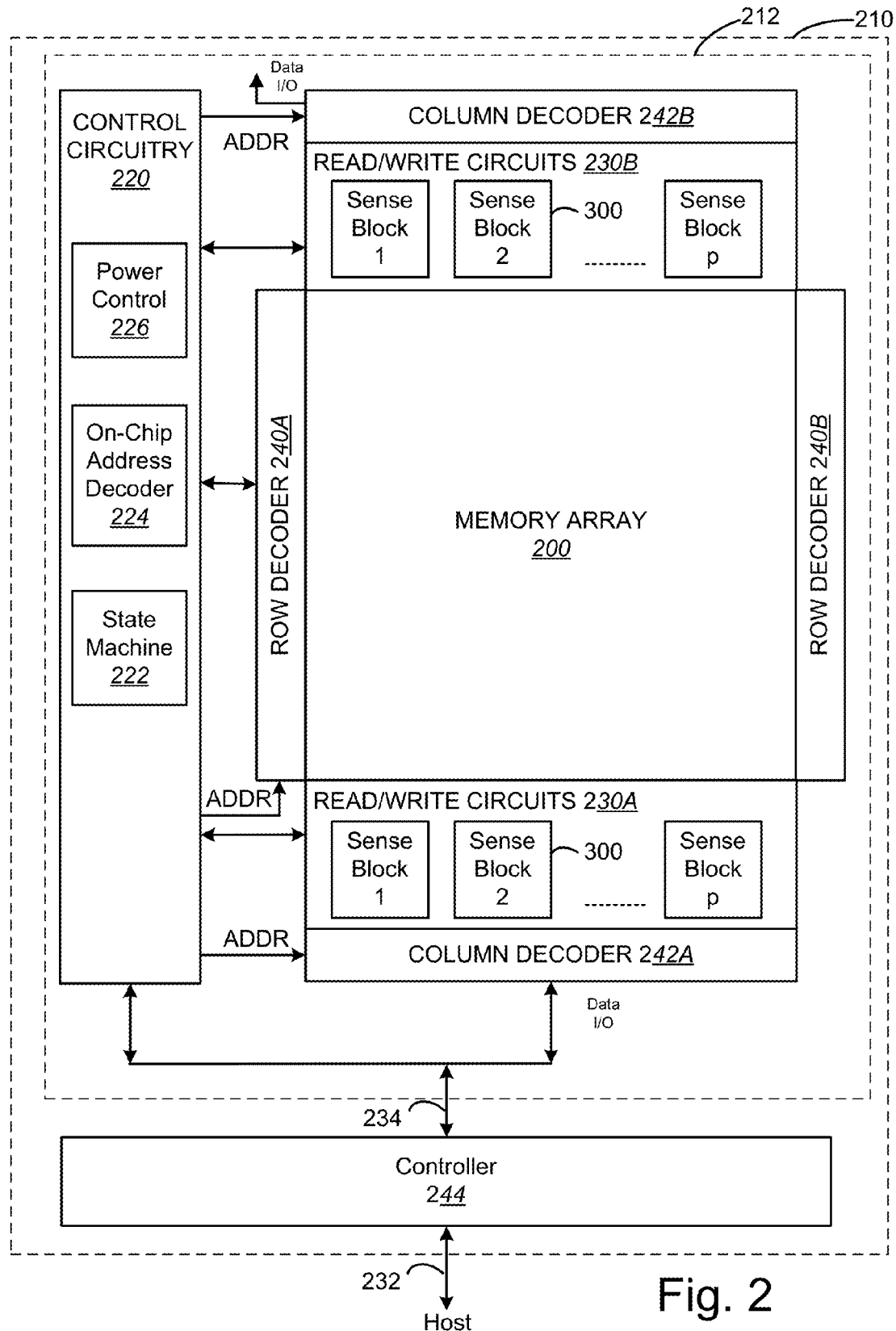
FIG. 2 illustrates a non-volatile storage device that may include one or more memory die or chips.

FIG. 2 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks (Sense Block 1, Sense Block 2, . . . Sense Block p) 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 3:
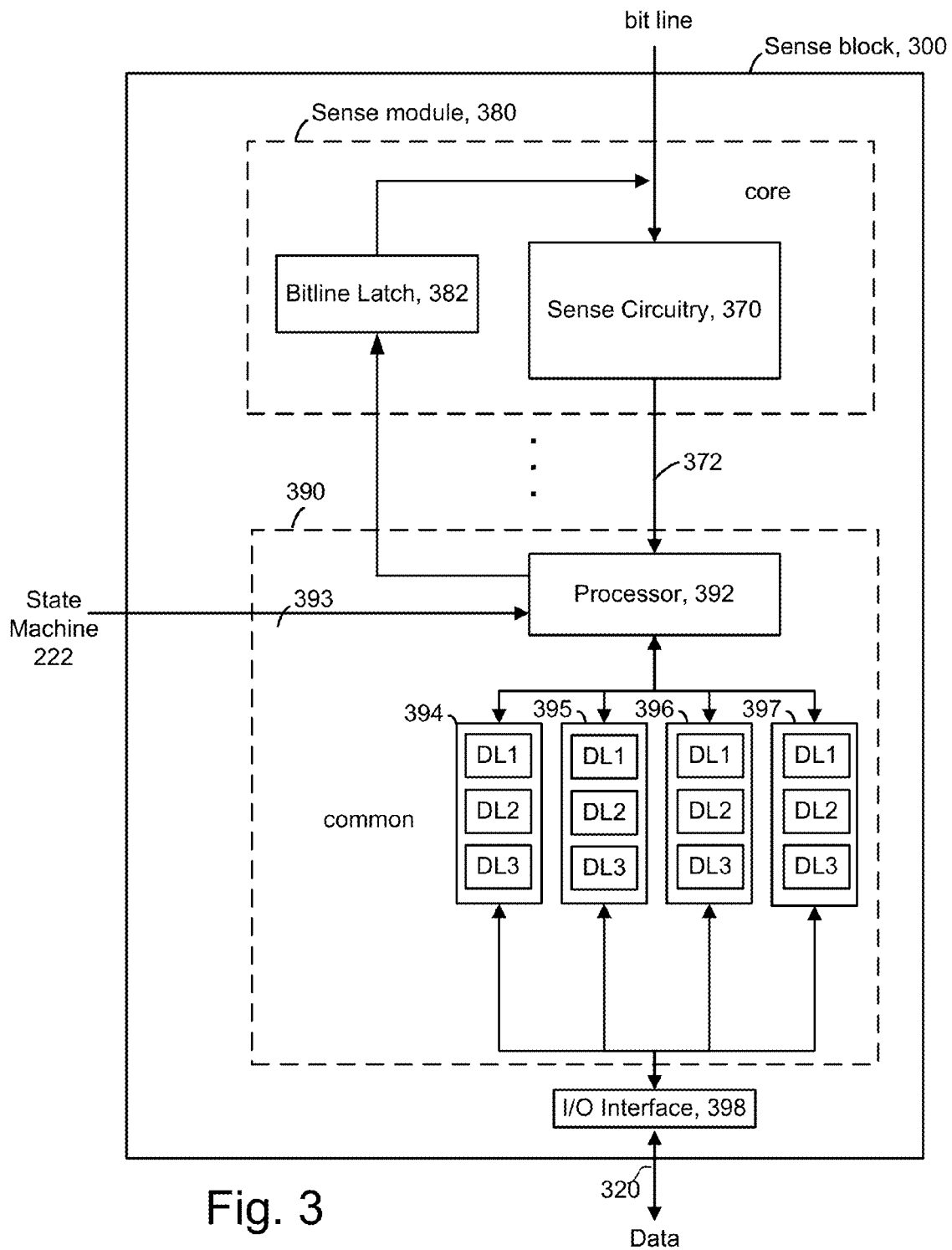
FIG. 3 is a block diagram depicting one embodiment of a sense block.

FIG. 3 is a block diagram depicting one embodiment of a sense block 300. An individual sense block 300 is partitioned into a core portion, referred to as a sense module 380, and a common portion 390. In one embodiment, there is a separate sense module 380 for each bit line and one common portion 390 for a set of multiple sense modules 380. In one example, a sense block 300 will include one common portion 390 and eight sense modules 380. Each of the sense modules in a group will communicate with the associated common portion via a data bus 372.

Sense module 380 comprises sense circuitry 370 that determines whether a conduction current in a connected bit line is above or below a predetermined threshold level. Sense module 380 also includes a bit line latch 382 that is used to set a voltage condition on the connected bit line. For example, a predetermined state latched in bit line latch 382 will result in the connected bit line being pulled to a state designating program inhibit (e.g., 1.5-3 V). As an example, a flag=0 can inhibit programming, while flag=1 does not inhibit programming.

Common portion 390 comprises a processor 392, three example sets of data latches 394 and an I/O Interface 398 coupled between the sets of data latches 394 and data bus 320. One set of data latches can be provided for each sense module, and three data latches identified by DL1, DL2, and DL3 may be provided for each set. The use of the data latches is further discussed below.

Processor 392 performs computations. For example, one of its functions is to determine the data stored in the sensed storage element and store the determined data in the set of data latches. At least some of the data latches in a set of data latches (e.g., 394) are used to store data bits determined by processor 392 during a read operation. At least some of the data latches in a set of data latches are also used to store data bits imported from the data bus 320 during a program operation. The imported data bits represent write data meant to be programmed into the memory. I/O interface 398 provides an interface between data latches 394-397 and the data bus 320.

In one embodiment, program is stored in the DL1 and DL2 latches at the beginning of the program operation. Note this describes programming two bits per memory cell. In one embodiment, during a read operation, the DL1 and DL2 latches are used to store the two bits that are read from the memory cell. Note that there may be more than two bits per memory cell. There can be one additional latch for each additional bit to be stored per memory cell.

During reading or other sensing, the state machine 222 controls the supply of different control gate voltages to the addressed storage element. As it steps through the various control gate voltages corresponding to the various memory states supported by the memory, the sense module 380 may trip at one of these voltages and an output will be provided from sense module 380 to processor 392 via bus 372. At that point, processor 392 determines the resultant memory state by consideration of the tripping event(s) of the sense module and the information about the applied control gate voltage from the state machine via input lines 393. It then computes a binary encoding for the memory state and stores the resultant data bits into data latches (e.g., 394). In another embodiment of the core portion, bit line latch 382 serves both as a latch for latching the output of the sense module 380 and as a bit line latch as described above.

Some implementations can include multiple processors 392. In one embodiment, each processor 392 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 394-397 from the data bus 320. The program operation, under the control of the state machine, comprises a series of programming voltage pulses applied to the control gates of the addressed storage elements. Each program pulse is followed by a read back (verify) to determine if the storage element has been programmed to the desired memory state. Processor 392 monitors the read back memory state relative to the desired memory state. When the two are in agreement, the processor 392 sets the bit line latch 382 so as to cause the bit line to be pulled to a state designating program inhibit. This inhibits the storage element coupled to the bit line from further programming even if program pulses appear on its control gate. In other embodiments, the processor initially loads the bit line latch 382 and the sense circuitry sets it to an inhibit value during the verify process.

Each set of data latch stacks 394-397 contains a stack of data latches corresponding to the sense module 380, in one embodiment. In one embodiment, there are three data latches per sense module 380. All the DL1 and DL2 data latches corresponding to the read/write block of m storage elements can be linked together to form a block shift register so that a block of data can be input or output by serial transfer.

In one embodiment, one purpose of the DL1 and DL2 latches is to store data that is to be programmed into a storage element. For example, the storage elements may store two bits per storage element. In one embodiment, lower page data is initially stored into the DL1 latches and upper page data is initially stored into the DL2 latches.

In one embodiment, the storage elements store three bits per storage element. In this case, there may be an additional data latch (not depicted in FIG. 3) for initially storing the third bit of data that is to be programmed into a storage element. In one embodiment, the storage elements four bits per storage element, in which there may be two additional data latches (not depicted in FIG. 3) for initially storing the third and fourth bits of data that is to be programmed into a storage element. The storage elements could store more than four bits per storage element, in which case there may be one data latch for each bit.

In one embodiment, the DL1 latch is freed up during programming. This allows the DL1 latches to be used for background caching. In one embodiment, the DL1 latches are used to store status information during at least a part of the programming process. For example, the DL1 latches may be used to store verify status.

In one embodiment, the DL2 latches are used to store status information during programming. For example, the DL2 latches may be used to store verify status. In one embodiment, after the storage element has reached its target threshold voltage, the DL2 latch could be set to "1" to indicate that programming is complete for this storage element.

In one embodiment, the DL3 latches are used to store status information during programming. In one embodiment, programming is slowed as the storage element nears the target threshold level. For example, a given DL3 latch may identify that its associated storage element's Vth is above a lower verify level (e.g., VvaL or VvbL in FIG. 5A). If that storage element is not yet locked out, then it may receive slower programming. If the DL3 latch indicates the storage element's Vth is below the lower verify level, then it may be in a fast programming mode. Further details are discussed below.

Program data that was originally in the DL2 latches is preserved in a logical combination of the DL2 and DL3 latches during programming in one embodiment. Therefore, if a program error occurs during programming, the original program data stored in the DL2 latches may be recovered. In one embodiment, the upper page data that was originally stored in the DL2 latches is preserved in some combination of the DL2 and DL3 latches for at least a portion of the programming sequence. For example, the upper page data can be recovered by performing a logical operation on the contents of the DL2 and DL3 latches, depending on when the program error occurred. Note that as previously mentioned, both the DL2 and DL3 latches may be used for verify status during programming. In one embodiment, the DL2 and DL3 latches are used to store verify status while they are both being used to preserve the upper page data. However, despite storing verify status information in the latches, the original upper page data can still be recovered by appropriate reading of the DL2 and DL3 latches.

Figure 4:
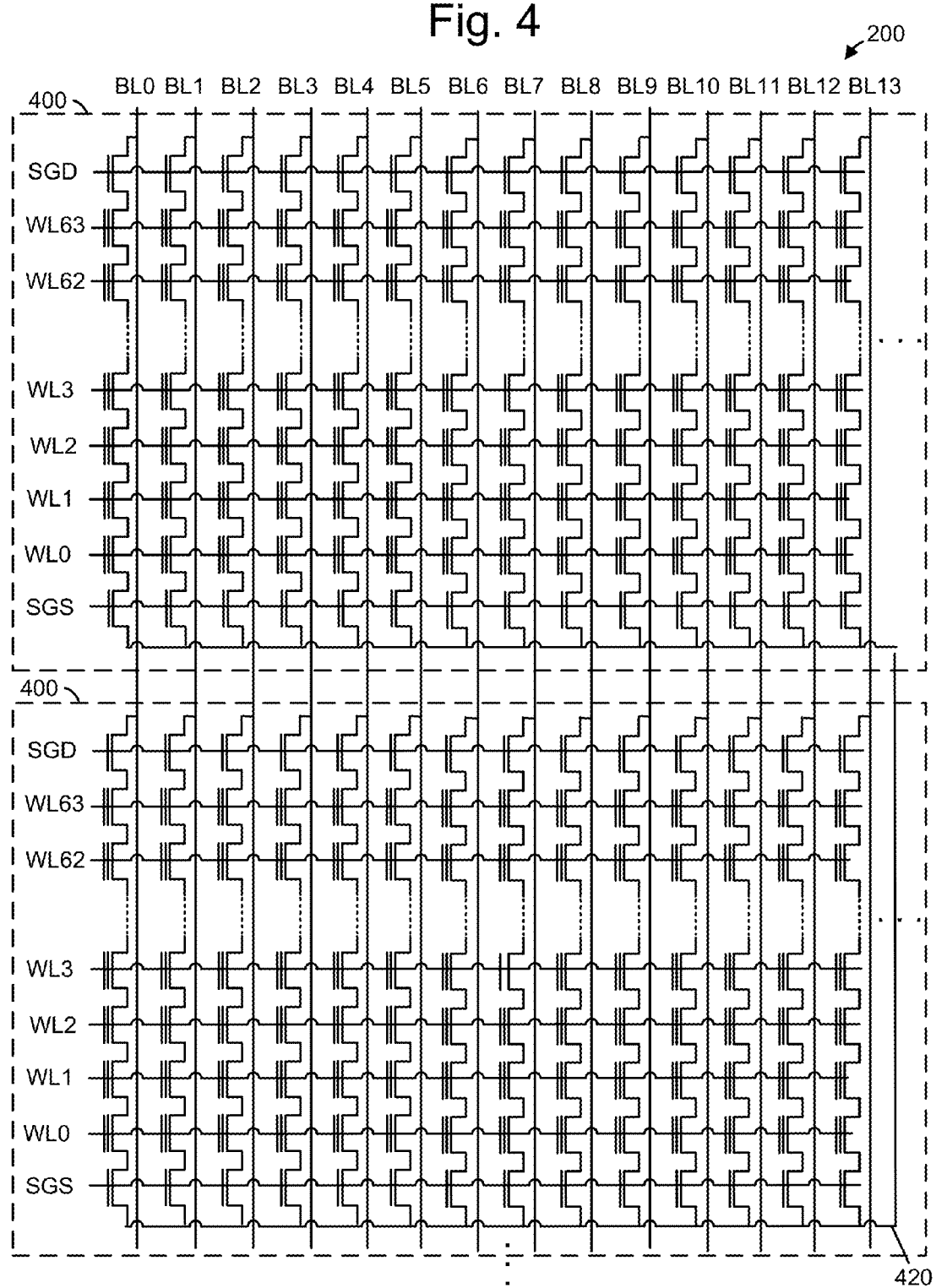
FIG. 4 depicts blocks of NAND flash memory cells in the memory array of FIG. 2.

In one embodiment, the lower page data originally stored in the DL1 latches can also be recovered if there is a program error while programming the lower page. In one embodiment, both lower and upper page programming may recover write data if there is a program error. In one embodiment, both lower and upper page data may be recovered if there is a program error. FIG. 4 depicts blocks of NAND flash memory cells in the memory array 200 of FIG. 2. The memory array can include many blocks 400. Two example blocks 400 are depicted in FIG. 4. Each block 400 includes a number of NAND strings. A set of bit lines, e.g., BL0, BL1, . . . may be shared among the blocks. Thus, each NAND string is associated with one bit line. Each NAND string is connected at one end to a drain select gate (SGD), and the control gates of the drain select gates are connected via a common SGD line. The NAND strings are connected at their other end to a source select gate which, in turn, is connected to a common source line 420. Sixty-four word lines, for example, WL0-WL63, extend between the source select gates and the drain select gates.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Note that there may be thousands, or tens of thousands of bit lines. Therefore, a single word line may be used by tens of thousands of storage elements. Typically, there is a driver at one and of the word line that provides the read reference voltages or the programming voltages.

FIG. 5A depicts an example set of threshold voltage distributions for an eight-state memory device in which each storage element stores three bits of data. A first threshold voltage (Vth) distribution is provided for erased (Er-state) storage elements. Seven Vth distributions represent programmed states A through G. In one embodiment, the threshold voltages in the Er-state are negative and the threshold voltages in the A-G distributions are positive. However, all or a part of the threshold distribution in the Er-state may be positive. Also, all or a part of the threshold distribution of the A-state may be negative (likewise for other data states).

Read reference voltages, Vra, Vrb, Vrc, etc. are also provided for reading data from storage elements. By testing whether the threshold voltage of a given storage element is above or below Vra, Vrb, Vrc, etc. the system can determine the state, e.g., programming condition, the storage element is in.

Further, verify reference voltages, Vva, Vvb, Vvc, etc. are provided. When programming storage elements to the A-state, B-state, C-state, etc. the system will test whether those storage elements have a threshold voltage greater than or equal to Vva, Vvb, Vvc, etc.

In one embodiment, known as full sequence programming, storage elements can be programmed from the Er-state directly to any of the programmed states A-G. For example, a population of storage elements to be programmed may first be erased so that all storage elements in the population are in the Er-state. A series of program pulses will then be used to program storage elements into their respective target states A-G. While some storage elements are being programmed from the Er-state to the A-state, other storage elements are being programmed from the Er-state to the B-state, etc.

FIG. 5A also shows verify low reference voltages VvAL, VvBL, VvCL, etc. These reference voltages may be used during a program verify operation to determine whether a storage element is near its intended target threshold. If so, then programming speed may slow down. In one embodiment, Vdd is applied to bit lines that have reached their target state and are inhibited from further programming. Bit lines of storage elements that are still below the verify low level may be grounded to allow for fast programming. However, when between the verify low level and the normal verify level, the bit line may receive an intermediate voltage (e.g., between ground and Vdd) to cause slow or moderate speed programming. As one example, the intermediate voltage could be about 0.6V to 0.8V. However, the intermediate voltage could be either below or above this range. In one embodiment, the DL3 latch indicates where the storage element is in this programming sequence. Further details are discussed below. In one embodiment, storage elements being programmed to the G-state do not receive the slow (or moderate) speed programming. Hence, no verify low reference voltage is depicted in FIG. 5A for the G-state. However, there may be a VvGL for the G-state, if desired.

In one embodiment, multiple passes may be used to program the storage elements. For example, one pass may be used to program each bit. Thus, in the case of storing three bits per memory cell, there may be three passes. In the case of storing two bits per memory cell, there may be two passes. In one embodiment, a multi-state storage element stores data for three different pages: a lower page, a middle page, and an upper page. The eight states, and the bits they represent, may be: Er-state (111), A-state (011), B-state (101), C-state (001), D-state (110), E-state (010), F-state (100), and G-state (000). For Er-state, all pages store a "1." For A-state, the lower page stores a "0", the middle page stores a "1" the upper page stores a "1." Other states can be deduced in a similar manner. Note that although specific bit patterns have been assigned to each of the states, different bit patterns may also be assigned. Also note that this bit and page assignment may be used for other programming sequences, such as the fast/slow programming described above.

Although the programming examples depict eight data states and three pages of data, the concepts taught can be applied to other implementations with more or fewer than eight states and more or fewer than three pages. Moreover, in the example programming techniques discussed, the Vth of a storage element is raised gradually as it is programmed to a target data state. However, programming techniques can be used in which the Vth of a storage element is lowered gradually as it is programmed to a target data state. Programming techniques which measure storage element current can be used as well. The concepts herein can be adapted to the different programming techniques.

FIG. 5B illustrates that Vt distributions can partially overlap since the error correction algorithm can handle a certain percentage of cells that are in error. Note that in some embodiments, at one point in time the threshold voltage distribution may resemble FIG. 5A and at another time the threshold voltage distributions may overlap, as in FIG. 5B. For example, just after programming, the threshold voltage distribution may resemble FIG. 5A. However, over time, the threshold voltages of memory cells may shift, such that there may be overlap.

However, there may be overlap between at least some neighboring threshold distributions immediately after programming. Note that it can be very difficult to detect word line defects when there is overlap between neighboring Vt thresholds.

Also note that contrary to the equal spacing/width of the depicted threshold voltage distributions, various distributions may have different widths/spacings in order to accommodate varying amounts of susceptibility to data retention loss.

Figure 6A:
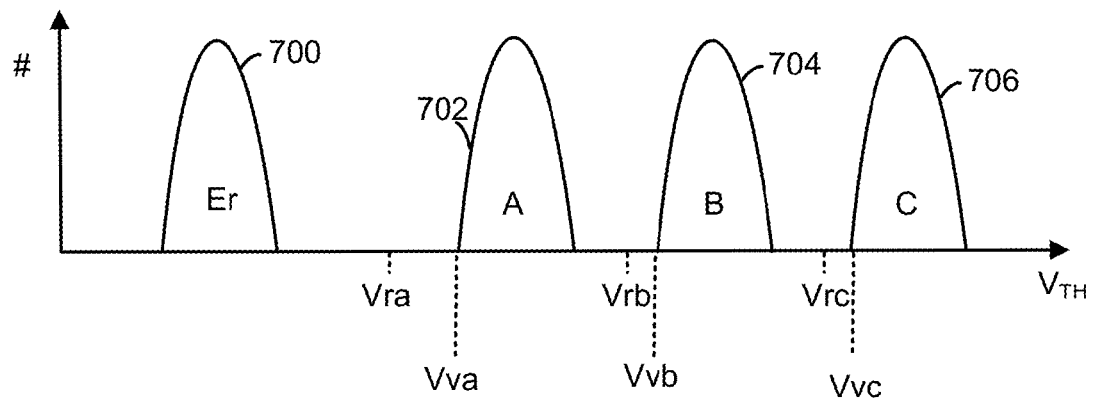
FIG. 6A depicts an example set of threshold voltage distributions for a four-state memory device in which each storage element stores two bits of data in accordance with one embodiment.

FIG. 6A depicts an example set of threshold voltage distributions for a four-state memory device in which each storage element stores two bits of data. A first threshold voltage (Vth) distribution 700 is provided for erased (Er-state) storage elements. Three Vth distributions 702, 704 and 706 represent programmed states A, B and C, respectively. In one embodiment, the threshold voltages in the Er-state are negative and the threshold voltages in the A, B and C distributions are positive. However, all or a part of the threshold distribution in the Er-state may be positive. Also, all or a part of the threshold distribution of the A-state may be negative (likewise for other data states).

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

Figure 6B:
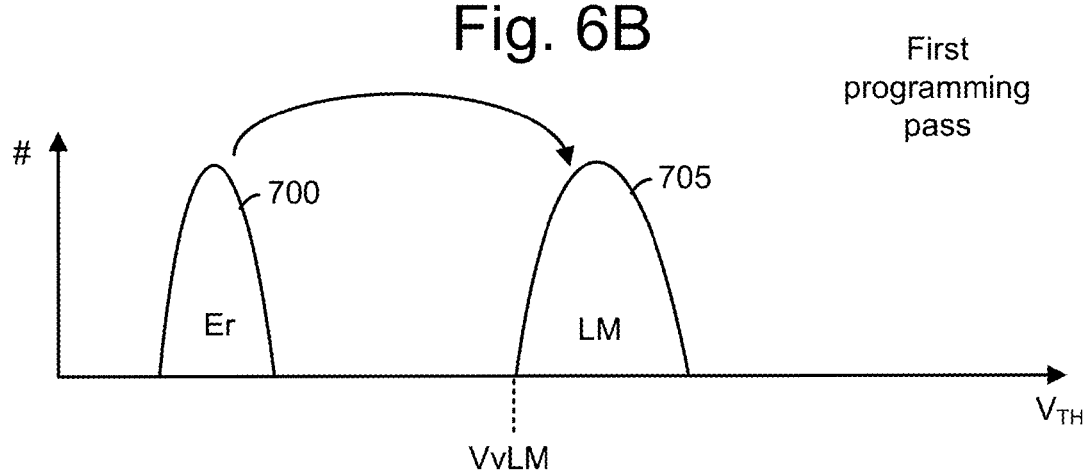
FIGS. 6B and 6C depict a two pass programming sequence in accordance with one embodiment.
Figure 6C:
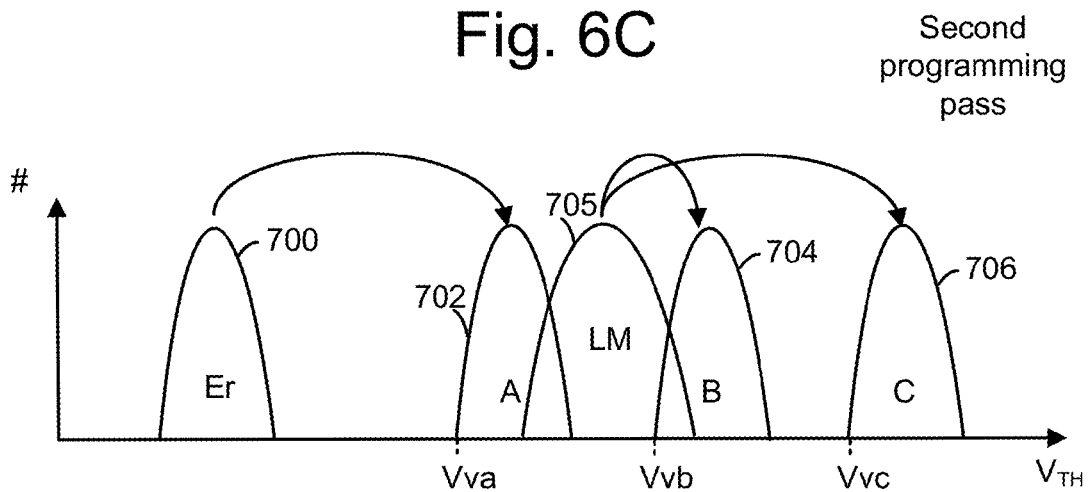

FIGS. 6B and 6C depict a two pass programming sequence in accordance with one embodiment. In the first pass, the lower page is programmed. In the second pass the upper page is programmed. As depicted in FIG. 6B, in the first pass storage elements intended for either the B- or C-states are programmed to an intermediate state 705. The intermediate state 705 has a verify level of VvLM.

As depicted in FIG. 6C, in the second pass programming to the A-, B-, and C-states is completed. Storage elements targeted for the A-state are programmed from the Er-state 700 to the A-state 702. Storage elements targeted for the B-state are programmed from the LM-state 705 to the B-state 704. Storage elements targeted for the c-state are programmed from the LM-state 705 to the C-state 706.

FIGS. 7A-7C depict one embodiment of a three pass programming sequence. The first pass depicted in FIG. 7A programs the lower page. Thus, in the first pass storage elements intended for either the B- or C-states are programmed to an intermediate state 705.

FIG. 7B depicts the second programming pass in which the B- and C-states are programmed. Storage elements targeted for the B-state are programmed from the LM-state 705 to the B-state 704. Storage elements targeted for the C-state are programmed from the LM-state 705 to the C-state 706. However, note that the A-state is not programmed during the second programming pass.

FIG. 7C depicts a third programming pass in which the A-state is programmed. Storage elements targeted for the A-state are programmed from the Er-state 700 to the A-state 702. Thus, note that the A-state programming is not started until the B- and C-states are complete.

Figure 8A:
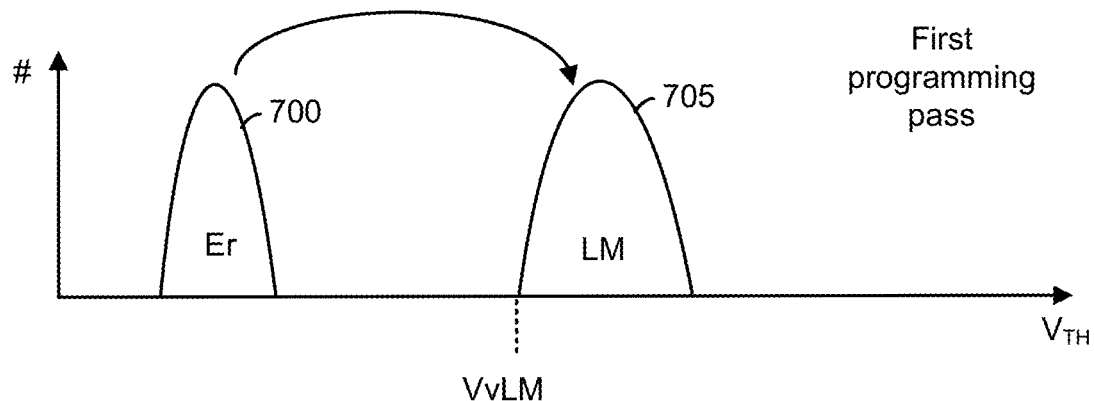
FIGS. 8A, 8B, and 8C depict one embodiment of a three pass programming sequence in which the C-state is programmed prior to starting the other states.
Figure 8B:
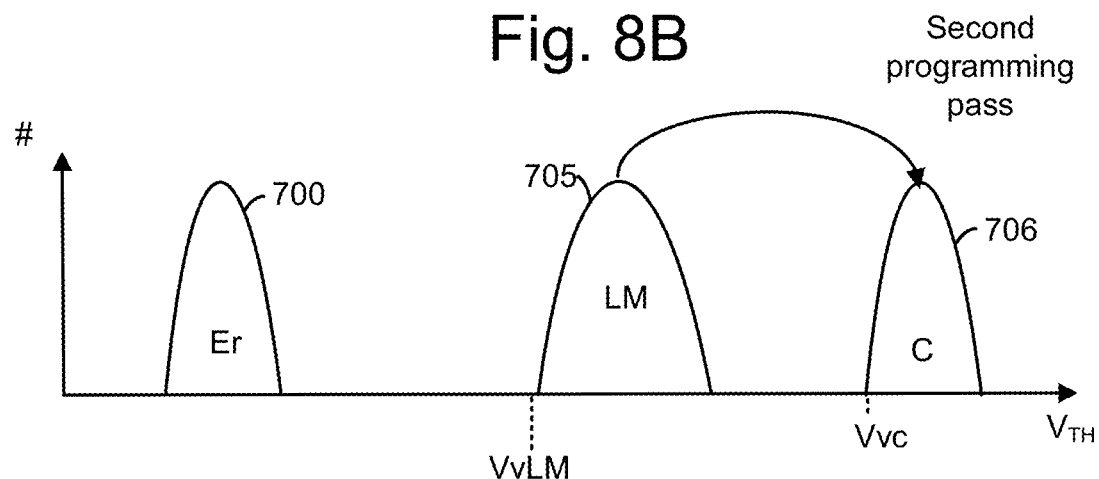
Figure 8C:
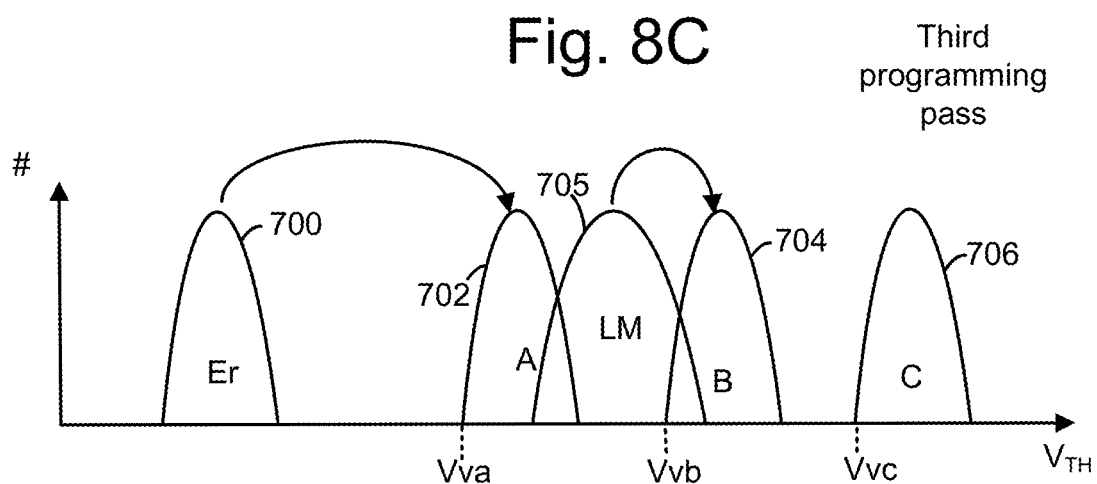

FIGS. 8A, 8B and 8C depict one embodiment of a three pass programming sequence in which the C-state is programmed prior to starting the other states. The first pass depicted in FIG. 8A programs the lower page. Thus, in the first pass storage elements intended for either the B- or C-states are programmed to an intermediate state 705. FIG. 8B depicts the C-state being programmed. Storage elements targeted for the C-state are programmed from the intermediate state 705 to the C-state 706.

FIG. 8C depicts the A- and B-states being programmed. Storage elements targeted for the A-state are programmed from the Er-state 700 to the A-state 702. Storage elements targeted for the B-state are programmed from the intermediate state 705 to the B-state 704.

In one embodiment, known as full sequence programming, storage elements can be programmed from the Er-state directly to any of the programmed states A, B or C. For example, a population of storage elements to be programmed may first be erased so that all storage elements in the population are in the Er-state. A series of program pulses such as depicted in FIG. 9C will then be used to program storage elements directly into states A, B or C. While some storage elements are being programmed from the Er-state to the A-state, other storage elements are being programmed from the Er-state to the B-state and/or from the Er-state to the C-state.

Figure 9A:
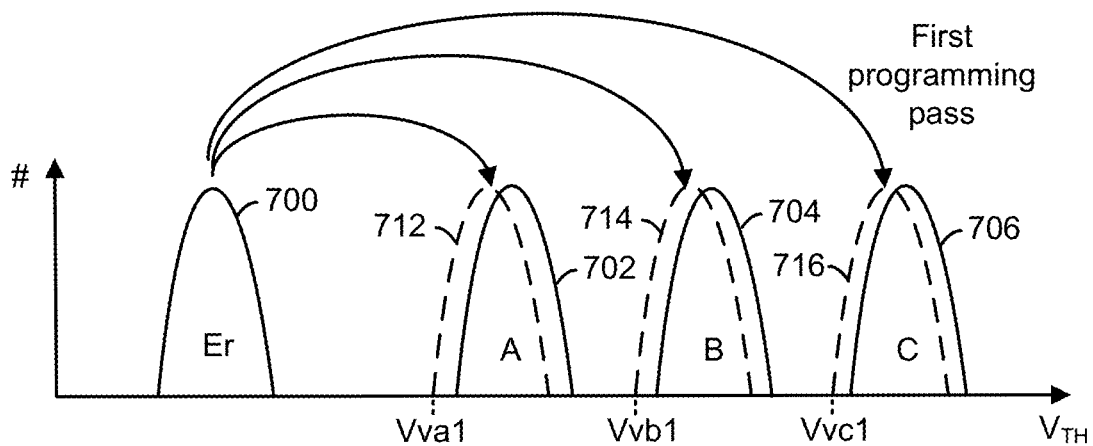
FIG. 9A illustrates one embodiment of a first pass of another two-pass programming technique.
Figure 9B:
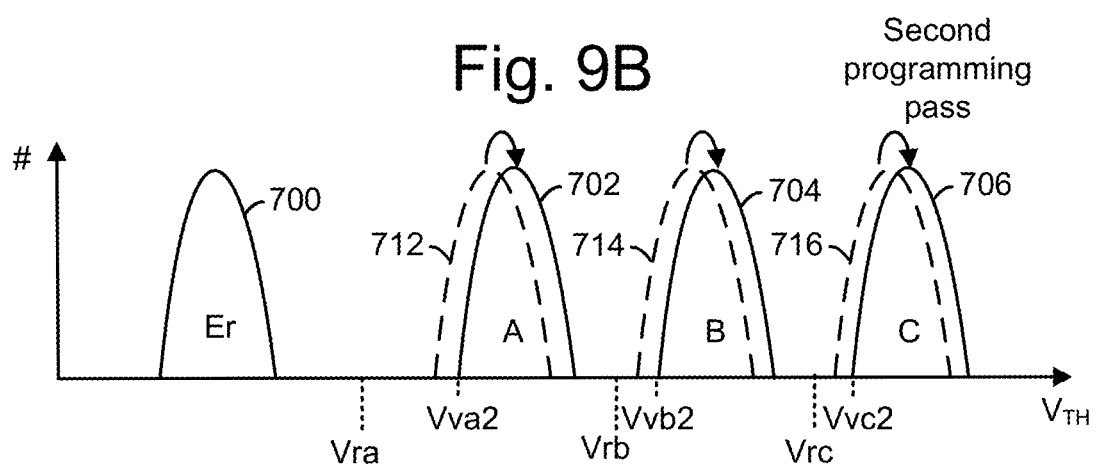
FIG. 9B illustrates one embodiment of a second pass of the two-pass programming technique of FIG. 9A.
Figure 9C:
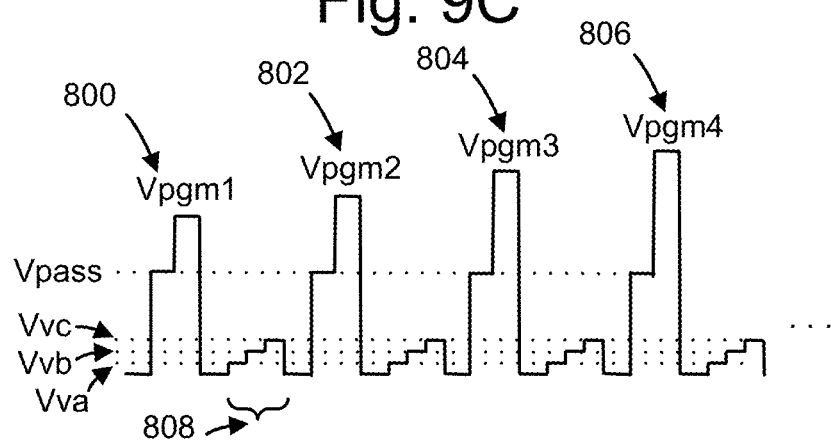
FIG. 9C depicts a series of program and verify pulses which are applied to a selected word line during one embodiment of a programming operation.

FIG. 9A illustrates a first pass of another two-pass programming technique. In this example, referred to as foggy-fine programming, the A-state, B-state and C-state storage elements are programmed from the Er-state to distributions 712, 714 and 716, respectively, using lower verify levels Vva1, Vvb1 and Vvc1, respectively. This is the foggy programming pass. A relatively large program voltage step size may be used, for instance, to quickly program the storage elements to the respective lower verify levels. FIG. 9B illustrates a second pass of the two-pass programming technique of FIG. 9A. The A-state, B-state and C-state storage elements are programmed from the respective lower distributions to respective final distributions 702, 704 and 706, respectively, using the nominal, higher verify levels Vva2, Vvb2 and Vvc2, respectively. This is the fine programming pass. A relatively small program voltage step size may be used, for instance, to slowly program the storage elements to the respective final verify levels while avoiding a large overshoot. In some embodiments, a quick pass write (QPW) or slow programming mode when a storage element is near its target threshold voltage level. For example, verify low levels such as VvaL, VvbL, and VvcL may be used. In one embodiment, QPW is used for A-, B-, and C-states. In one embodiment, QPW is used for A- and B-states, but not for the C-state. For example, lower verify levels can be used when programming the A-, B- and C-states in FIG. 6C.

In one embodiment, a lower verify level is not used for the C-state. In one embodiment, lower verify levels can be used when programming the B- and C-states in FIG. 7B. In one embodiment, a lower verify level is not used for the C-state. In one embodiment, lower verify levels can be used when programming the A-state in FIG. 7C.

In one embodiment, a lower verify level is used for the C-state in FIG. 8B. In one embodiment, lower verify levels can be used when programming the A-, and B-states in FIG. 8C.

Although the programming examples depict four data states and two pages of data, the concepts taught can be applied to other implementations with more or fewer than four states and more or fewer than two pages. For example, memory devices with eight, sixteen or more states per storage element may be used.

Moreover, in the example programming techniques discussed, the Vth of a storage element is raised gradually as it is programmed to a target data state. However, programming techniques can be used in which the Vth of a storage element is lowered gradually as it is programmed to a target data state. Programming techniques which measure storage element current can be used as well. The concepts herein can be adapted to the different programming techniques.

FIG. 9C depicts a series of program and verify pulses which are applied to a selected word line during a programming operation. A programming operation may include multiple program-verify iterations, where each iteration applies a program voltage followed by verify voltages, to a selected word line. In one possible approach, the program voltages are stepped up in successive iterations. Moreover, each program voltage may include a first portion which has a pass voltage (Vpass) level, e.g., 6-8 V, followed by a second, highest amplitude portion at a program level, e.g., 12-25 V. For example, a first, second, third and fourth program pulses 800, 802, 804 and 806 have program levels of Vpgm1, Vpgm2, Vpgm3 and Vpgm4, respectively, and so forth. One or more verify voltages, such as example verify voltages Vva, Vvb and Vvc (808), may be provided after each program pulse. In some cases, one or more initial program pulses are not followed by verify pulses because it is not expected that any storage elements have reached the lowest program state (e.g., A-state). Subsequently, program iterations may use verify pulses for the A-state, followed by program iterations which use verify pulses for the A- and B-states, followed by program iterations which use verify pulses for the B- and C-states, for instance.

FIG. 10 is a flowchart describing one embodiment of a programming process, which includes one or more verification steps. Any of the programming sequences described herein may be used, as well as other programming sequences.

Embodiments disclosed herein are able to preserve program data within data latches used to program the memory cells in the event that a program error occurs during programming.

In step 1010, the program voltage (Vpgm) is set to an initial value. Also, in step 1010, a program counter (PC) is initialized to zero. In step 1020, a program pulse is applied.

In step 1022, a verification process is performed. In one embodiment, the verification is a concurrent coarse/fine verify. Referring to FIG. 5A, some memory cells that are being programmed to the A-state are verified for the VvaL level, while others that are being programmed to the A-state are verified for the Vva level. During the initial programming steps in which the memory cell's threshold is well below the final level (Vva), course programming may be applied. However, after the memory cell's threshold voltage reaches VvaL, fine programming may be used. Thus, while some memory cells are being verified for coarse programming, other memory cells are being verified for fine programming. Note that with course/fine programming, some memory cells are being verified for one state (e.g., A-state), while others are being verified for another state (e.g., B-state). Note that when a particular memory cell has been verified as being programmed to its intended state, it may be locked out from further programming.

In step 1024, it is determined whether memory cells have verified that their threshold voltages are at the final target voltage for that memory cell. Note that it is not required that every memory cell for a given state is verified to be at the appropriate threshold voltage. Error correction is able to correct for some memory cells being below their target threshold voltage. Error correction is able to correct for some memory cells being over-programmed. Step 1024 is referring to all states having completed programming.

If verification passes, the programming process is completed successfully (status=pass) in step 1026. If all of the memory cells are not all verified, then it is determined whether the program counter (PC) is less than a maximum value such as 20. If the program counter (PC) is not less than max (step 1028), then the program process has failed (step 1030). If the program counter (PC) is less than a maximum value (e.g., 20), then the program counter (PC) is incremented by 1 and the program voltage is stepped up to the next pulse in step 1032. Subsequent to step 1032, the process loops back to step 1020 and the next program pulse is applied to the memory cells.

Figure 11:
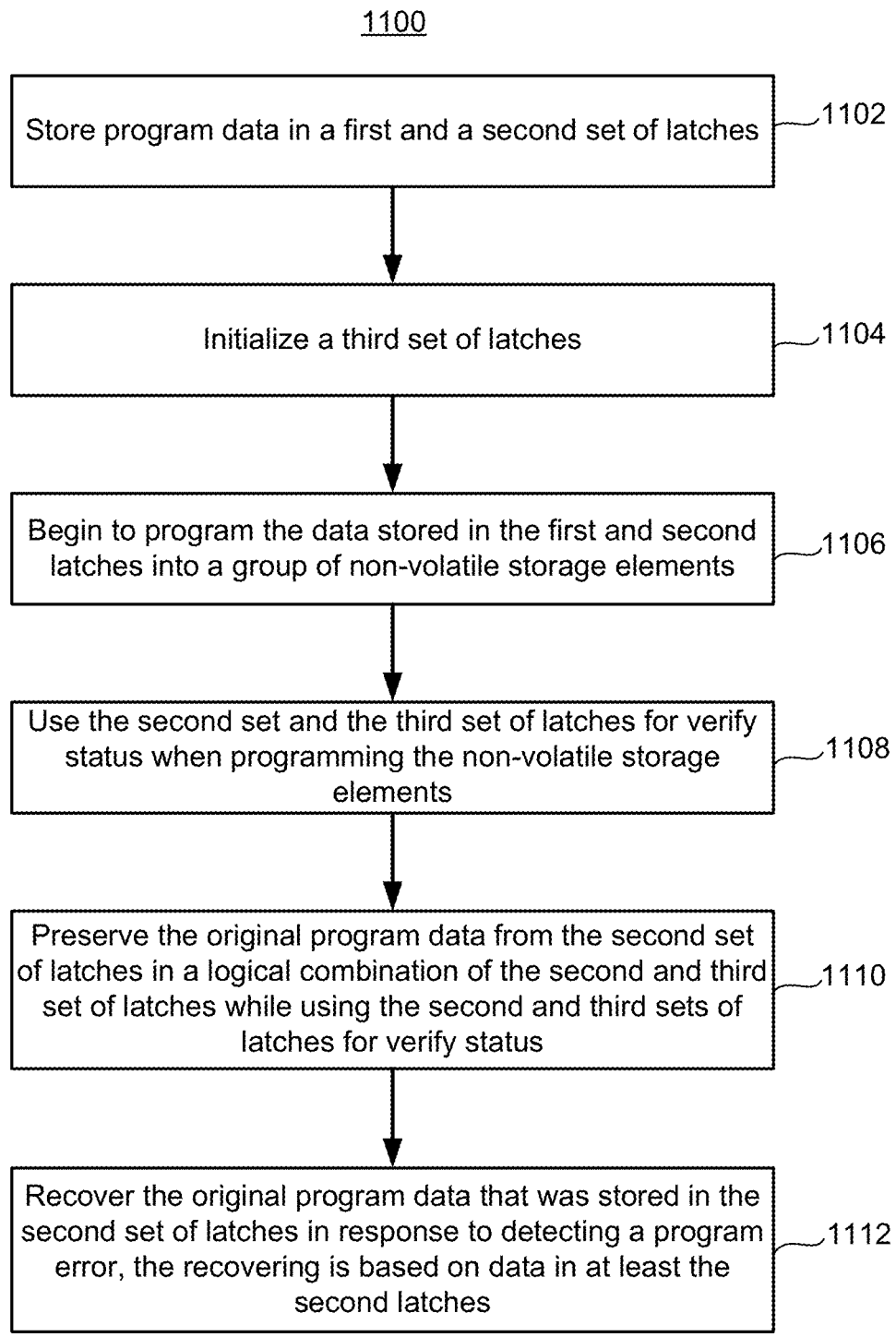
FIG. 11 is a flowchart of one embodiment of a process of preserving program data in latches while programming non-volatile storage.

FIG. 11 is a flowchart of one embodiment of a process 1100 of preserving program data in latches while programming non-volatile storage. Any of the programming sequences described herein may be used, as well as other programming sequences. Embodiments disclosed herein are able to preserve program data within data latches used to program the memory cells in the event that a program error occurs during programming.

In one embodiment, the process 1100 is used when storing two bits per memory cell. For example, a lower page and an upper page are stored in a group of non-volatile storage elements. In one embodiment, the process 1100 is used when storing three bits per memory cell. For example, a lower page, a middle page, and an upper page are stored in a group of non-volatile storage elements. In one embodiment, the process 1100 is used when storing four bits per memory cell. For example, a lower page, a lower-middle page, an upper-middle page, and an upper page are stored in a group of non-volatile storage elements.

In step 1102, program data is stored in a first set of latches and a second set of latches. In one embodiment, a lower page is stored in DL1 latches and an upper page is stored in DL2 latches.

In step 1104, a third set of latches are initialized. In one embodiment, DL3 latches are initialized.

In step 1106, programming the data stored in the first and second sets of latches is programmed into a group of non-volatile storage elements is begun. In one embodiment, a lower page in DL1 latches and an upper page in DL2 latches are programmed. As noted, a variety of programming sequences may be used. In one embodiment, first the lower page is programmed, then the upper page is programmed (see FIGS. 6B, 6C). However, in some embodiments, a given programming pass might involve the programming of both the upper and lower pages.

In step 1108, the second and third sets of latches are used for verify status while programming the non-volatile storage elements. For example, the DL2 and DL3 latches are used. Note that the DL1 latches might also be used to verify status.

In step 1110, the original program data in the DL2 latches is preserved in a combination of the DL2 and DL3 latches. In one embodiment, the program data is preserved in a combination of the DL2 and DL3 latches while using the DL2 and DL3 latches for verify status. In one embodiment, step 1110 includes converting (or modifying) data in the second and third sets of latches to preserve the original data from the second set of latches. In one embodiment, step 1110 includes converting (or modifying) data in the third sets of latches to preserve the original data from the second set of latches. In one embodiment, upper page data is preserved in a combination of the DL2 and DL3 latches. For example, data in the DL2 and DL3 latches is converted to preserve the upper page originally stored in the DL2 latches.

In step 1112, the original data from the second set of latches is recovered in response to detecting a program error. The recovery is based on data in at least the second set of latches. In one embodiment, step 1112 includes performing a logical operation on the second and third sets of latches to recover the original data from the second set of latches. For example, a logical operation may be performed on the DL2 and DL3 latches to recover the upper page that was originally stored in the DL2 latches.

Figure 12A:
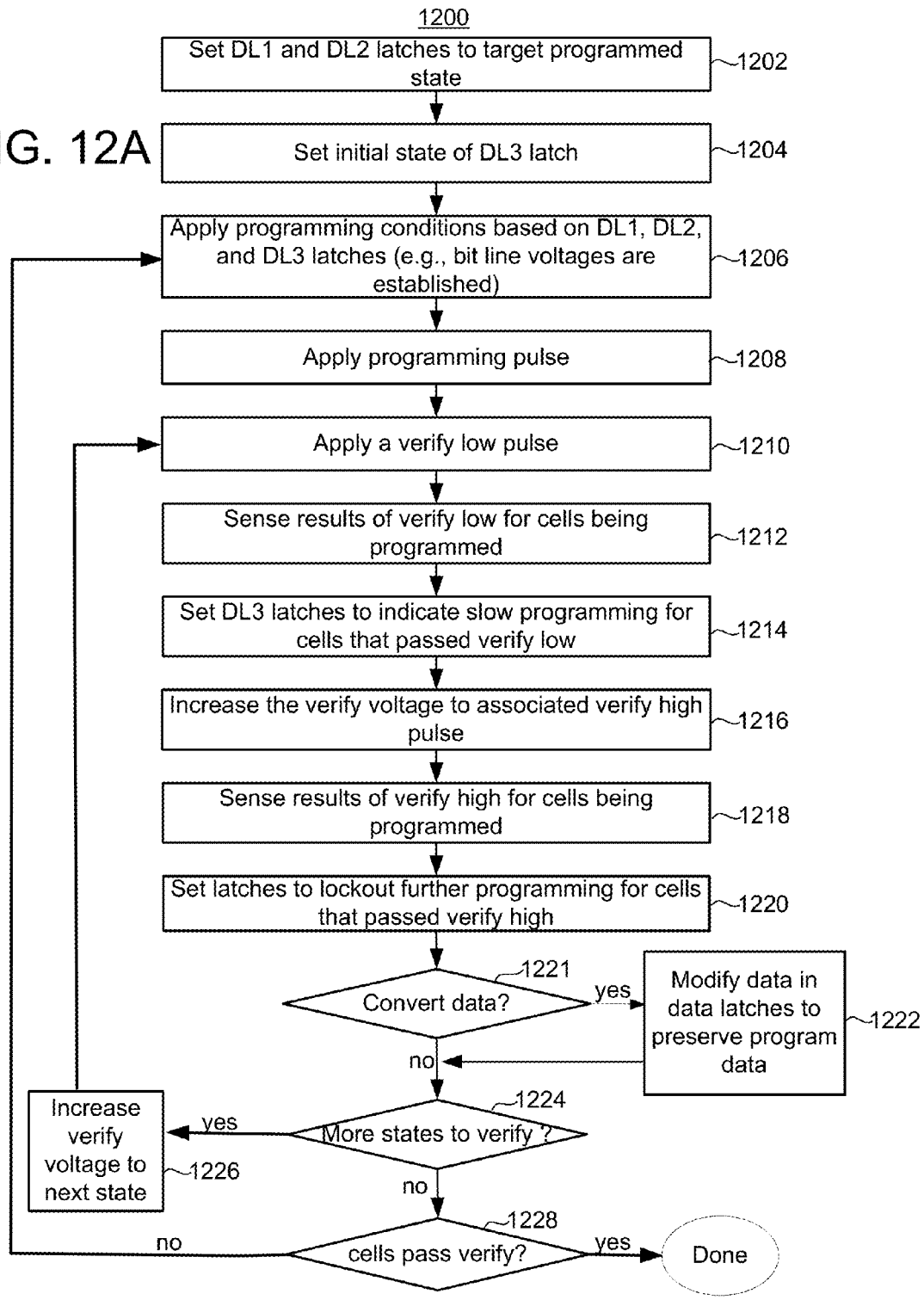
FIG. 12A is a flowchart of one embodiment of a process of operating data latches while programming and verifying non-volatile storage.

FIG. 12A is a flowchart of one embodiment of a process 1200 of operating data latches while programming and verifying non-volatile storage. Process 1200 preserves at least some of the program data in data latches that are used during programming of the memory cells. For example, upper page data may be preserved. Any of the programming sequences described herein may be used, as well as other programming sequences. Note that when performing a given programming sequence, there may be multiple passes or stages.

Reference will be made to a set of data latches 394 in FIG. 3. As noted above, two data latches DL1 and DL2 initially store the data to be programmed into the storage element in one embodiment that stores two bits per storage element. The third data latch, DL3 may be used for what is referred to herein as "quick pass write" (QPW) status. Note that there could be more or fewer than three latches.

Note that in FIG. 12A some examples are provided in which a latch is set to "1" to indicate some status. Alternatively, that status could be indicated by setting the latch to "0". Likewise, if an example is provided in which a latch is set to "0" to indicate some status, that particular status could be indicated by storing a "1" instead. The foregoing applies to examples described herein other than the examples of FIG. 12A.

In step 1202, data latches are set to their target program state. In one embodiment, DL1 and DL2 latches are set. For example, a lower page is stored in DL1 and an upper page is stored in DL2. Step 1202 is one embodiment of step 1102 of FIG. 11.

In step 1204, the DL3 latch is set to an initial state. The initial state may depend on which programming sequence is used. Several examples are described below. However, setting the DL3 latch is not limited to these examples. Step 1204 is one embodiment of step 1104 of FIG. 11.

In step 1206, programming conditions are applied based at least in part on the data latches (e.g., DL1, DL2, DL3). In one embodiment, the programming conditions are also based on what stage of the programming sequence is in progress. Further details are described with respect to examples below.

In one embodiment, bit line voltages are set in step 1206. In one embodiment, three categories are used. One category is for storage elements that are locked out (or inhibited) from any further programming, one is for storage elements that are still undergoing fast programming, and one is for storage elements that are to receive slower programming because they are near their target threshold voltages.

In one embodiment, bit lines for storage elements locked out or inhibited storage elements are set to Vdd, bit lines for storage elements undergoing nominal (or fast) programming are set to ground (e.g., Vss), bit lines for the third category are set to an intermediate voltage between ground and Vdd. This intermediate voltage slows down the programming to some extent. Note that other schemes may be used for applying voltages to bit lines.

In step 1208, one or more programming pulses are applied to the selected word line. A pass voltage (e.g., Vpass) may be applied to unselected word lines.

In step 1210, a verify low pulse is applied to the selected word line. This may be used to verify whether memory cells have been programmed to a specific state. The actual state to be verified may depend on which programming sequence is being used. Referring to FIG. 5A, VvBL may be applied if the B-state is being verified, as one example.

In step 1212, sensing is performed to determine whether storage elements that were intended to be programmed to the state associated with the verify low pulse have reached the verify low point. For example, storage elements intended to be programmed to the B-state (as indicated in one or more of DL1, DL2, and DL3) are sensed to determine whether their threshold voltage is at or above VvBL. In one embodiment, the current of the bit line is sensed.

In step 1214, the DL3 latches are set based on the results of step 1212. Note that the DL3 latches in question are those associated with the state that was just verified. In one embodiment, the DL3 latch is set to "1" to indicate that slow programming is to be performed. For example, storage elements intended to be programmed to the B-state that have a threshold voltage above VvBL have their DL3 latch set to "1". Step 1214 is one embodiment of step 1108 of FIG. 11. In one embodiment, the DL1 latches are used to store QPW status for at least a part of the programming sequence.

In step 1216, the verify reference voltage is increased to the associated verify high reference voltage for the present state being verified. For example, the reference voltage is set to VvB (see, FIG. 5A). In one embodiment, step 1216 involves increasing the voltage on the selected word line.

In step 1218, sensing is performed to determine whether storage elements that were intended to be programmed to the state associated with the nominal verify pulse have reached the nominal verify point. For example, storage elements intended to be programmed to the B-state are sensed to determine whether their threshold voltage is at or above VvB. In one embodiment, the current of the bit line is sensed.

In step 1220, the data latches are set based on the results of step 1218. In one embodiment, the DL2 latches are set to indicate the lockout status. This is one example of storing verify status in a latch. Note that the latches in question are those associated with the state that was just verified. Step 1220 is one embodiment of step 1108 of FIG. 11. Note that the DL1 latches might also be used to store lockout status. In some embodiments, both the DL1 and DL2 latches for a particular storage element are set to "1" to indicate the storage element is locked out.

In step 1221, a determination is made as to whether data in the latches should be modified (or converted) in order to preserve program data. In one embodiment, the conversion is performed after programming has progressed to a certain stage. For example, the conversion may be performed after a certain state has completed programming. Which state may depend on the programming sequence that is being used. For example, for one programming sequence, the data might be converted after the both the B and C states have completed programming (see FIG. 13A). For another programming sequence, the data might be converted after the C state has completed programming (see FIG. 16A).

The conversion is performed in step 1222, if appropriate. For example, data in the DL2 and/or DL3 latches may be modified to preserve the data originally stored in the DL2 latches. In one embodiment, data is modified in the DL3 latches but not the DL2 latches. Note that to eventually recover this data, in one embodiment, a logical operation might be performed on the DL2 and DL3 latches. As will be further described below, the decision on how to recover the data may be based on whether or not the data in the second and third latches was converted. In one embodiment, the data in the latches is converted only once during the programming sequence. Step 1222 is one embodiment of step 1110 of FIG. 11.

In step 1224, a determination is made whether there are additional states to verify. Note that early in the programming operation, it is not required that all states be verified. If there are more states to verify, then the verify reference voltage may be increased in step 1226. The reference voltage may be increased to the verify low reference level for the next state. For example, first the B-state might be verified, then the C-state is verified by raising the verify reference voltage. Then, the verify low pulse may be applied in step 1210. When all states that are to be verified at this time are verified, a determination is made whether a sufficient number of storage elements passed verify, in step 1228. Note that a certain number of storage elements may fail to reach their intended state, but be ignored. This can help to speed up programming.

If all but an allowed number of storage element do not pass verify, then the process 1200 returns to step 1206 to apply programming conditions based on the latches 394. For storage elements that are now locked out (as indicated by one or more of latches, such as DL2) their bit lines may be set to Vdd. For storage elements to receive slow programming, their bit lines may be set to the intermediate voltage. In one embodiment, the DL3 latch of those storage elements that are not locked out from further programming is checked to determine whether slow programming should be performed.

Note that a program error could be detected at a variety of points in the programming sequence. Also note that the program error might be detected before or after the data in the latches is converted to preserve the original program data stored in one (or more) of the latches. For example, a program error might be detected before or after the data is modified (or converted) in step 1222 of the process of FIG. 12A.

Figure 12B:
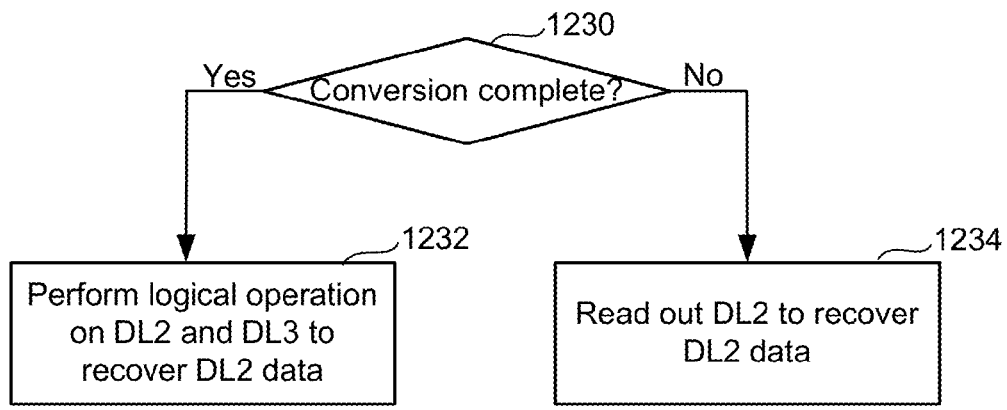
FIG. 12B is a flowchart of one embodiment of a process in which the recovery depends on whether the converting of the data in latches was completed prior to the program error.

The way in which the data is recovered depends on when the error occurred with respect to the converting of the data in the latches, in one embodiment. FIG. 12B is a flowchart of one embodiment of a process in which the recovery depends on whether the converting of the data in the DL2 and DL3 latches was completed prior to the program error. FIG. 12B is performed as a part of recovering the original data stored in the DL2 latches. It may be used as a part of one embodiment of step 1112 of FIG. 11. In one embodiment, upper page data is stored in the DL2 latches. As noted in the discussion of FIG. 12A, the DL2 latches are one example of a "second set" of latches.

In step 1230, a determination is made whether conversion of the data in the DL2 and DL3 latches was complete at the time of the program error. Referring to FIG. 12A as one example, the test is whether step 1222 has been performed. As noted, in some embodiments, step 1222 is performed only once. Thus note that performing step 1222 only once is sufficient to complete the conversion of the data, in one embodiment.

If the data has been converted, then in step 1232 a logical operation is performed on the data presently stored in the DL2 and DL3 latches to recover the program data that was originally stored in the DL2 latches. In one embodiment, this recovers upper page data.

If the data has not yet been converted, then in step 1234 the data presently stored in the DL2 latches is read out to recover the program data that was originally stored in the DL2 latches. In one embodiment, this recovers upper page data.

Figure 12C:
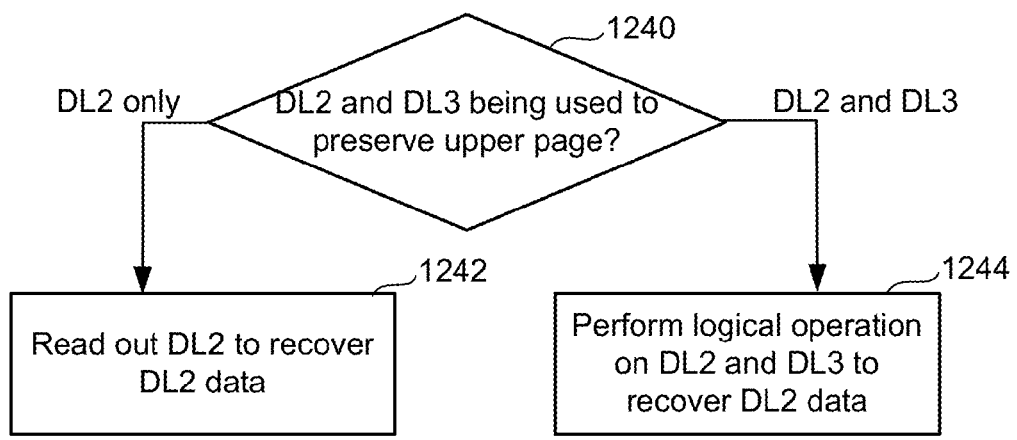
FIG. 12C is a flowchart of one embodiment of a process in which the recovery depends on whether the latches are being used to preserve the upper page at the time of the program error.

Note that in some embodiments, the DL2 and DL3 latches are used to preserve the upper page for only a portion of the programming sequence. FIG. 12C is a flowchart of one embodiment of a process in which the recovery depends on whether the DL2 and DL3 latches are being used to preserve the upper page at the time of the program error. FIG. 12C is performed as a part of recovering the original data stored in the DL2 latches. It may be used as a part of one embodiment of step 1112 of FIG. 11. In one embodiment, upper page data is stored in the DL2 latches. As noted in the discussion of FIG. 12A, the DL2 latches are one example of a "second set" of latches.

In step 1240, a determination is made whether the DL2 and DL3 latches are being used to preserve the upper page at the time of the program error. If they are, then in step 1244 a logical operation is performed on the data presently stored in the DL2 and DL3 latches to recover the program data that was originally stored in the DL2 latches. In one embodiment, this recovers upper page data. If they are not (e.g., only the DL2 latches are being used to store the upper page), then in step 1242 the data presently stored in the DL2 latches is read out to recover the program data that was originally stored in the DL2 latches. In one embodiment, this recovers upper page data.

As noted in some embodiments, the DL2 and DL3 latches are used to preserve the upper page for only a portion of the programming sequence. In one embodiment, upper page data is preserved in a combination of the DL2 and DL3 latches during a portion of the programming sequence. Then, the upper page data is re-generated from the DL2 and DL3 latches and re-stored back to the DL2 latches later in the programming sequence.

Figure 12D:
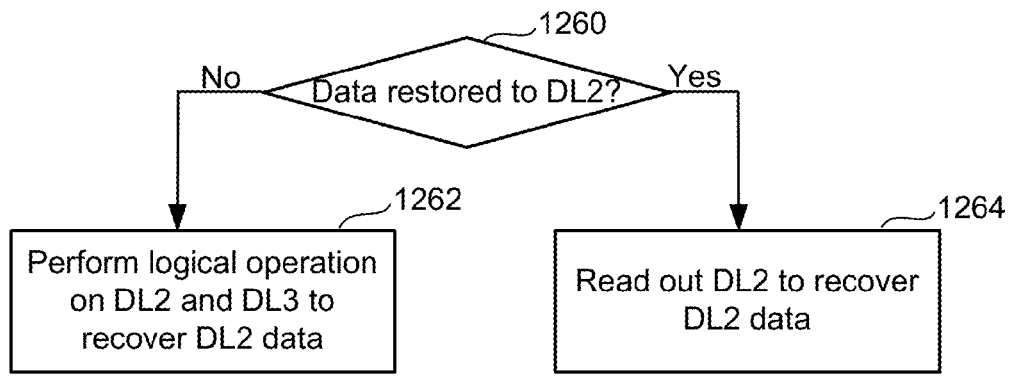
FIG. 12D is a flowchart of one embodiment of a process in which the recovery depends on whether the upper page data has been restored back to the DL2 latches.

FIG. 12D is a flowchart of one embodiment of a process in which the recovery depends on whether the upper page data has been restored back to the DL2 latches. FIG. 12D is performed as a part of recovering the original data stored in the DL2 latches. It may be used as a part of one embodiment of step 1112 of FIG. 11. In one embodiment, upper page data is initially stored in the DL2 latches. As noted in the discussion of FIG. 12A, the DL2 latches are one example of a "second set" of latches.

Figure 18A:
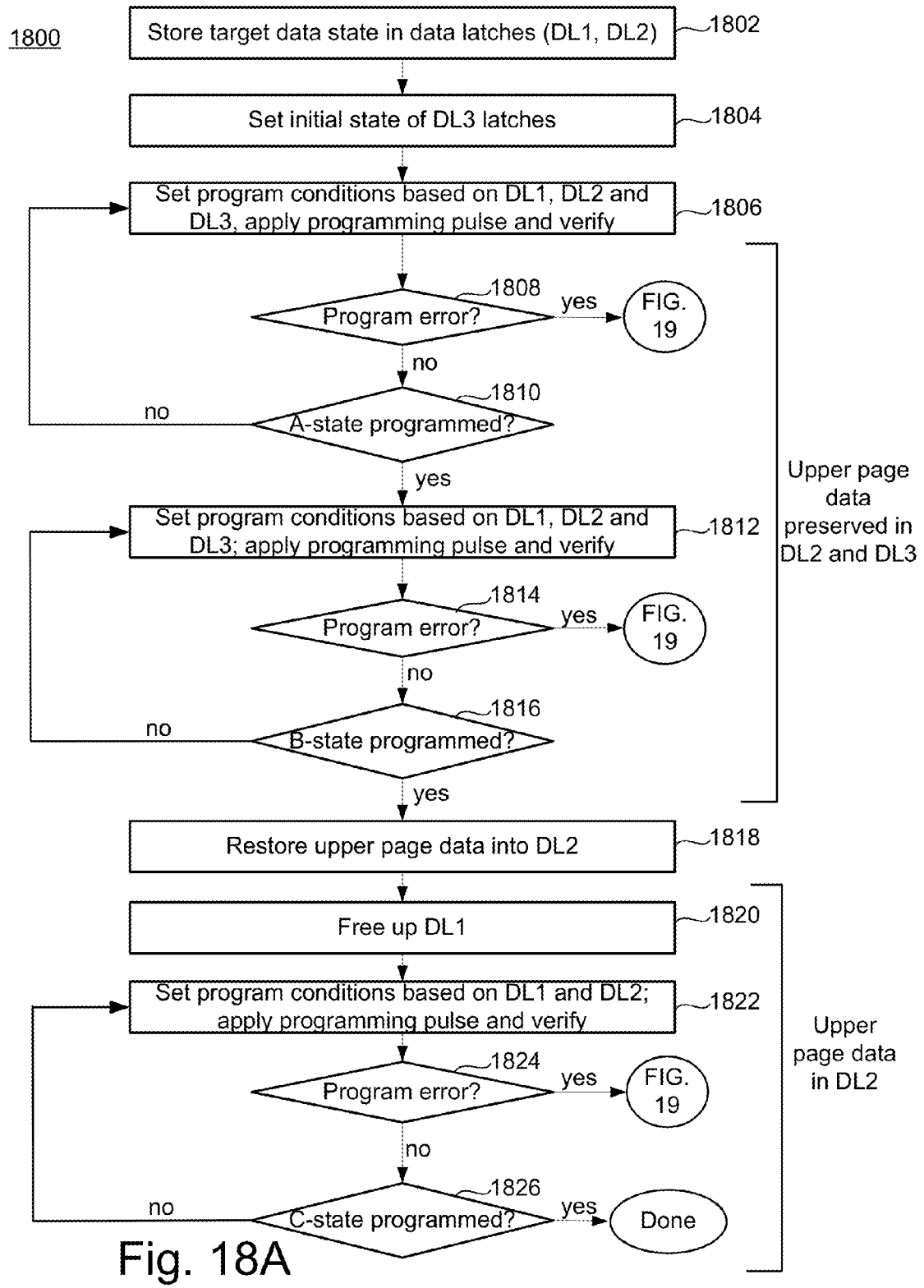
FIG. 18A is a flowchart of one embodiment of a process in which the A-, B-, and C-states are all programmed in the same programming pass.

In step 1260, a determination is made whether the original program data has been restored back to the DL2 latches. If it has not yet been restored, then in step 1262 a logical operation is performed on the data presently stored in the DL2 and DL3 latches to recover the program data that was originally stored in the DL2 latches. In one embodiment, this recovers upper page data. If the data has been restored (e.g., only the DL2 latches are being used to store the upper page), then in step 1264 the data presently stored in the DL2 latches is read out to recover the program data that was originally stored in the DL2 latches. In one embodiment, this recovers upper page data. FIG. 18A describes one embodiment in which the process of FIG. 12D is used.

Figure 13A:
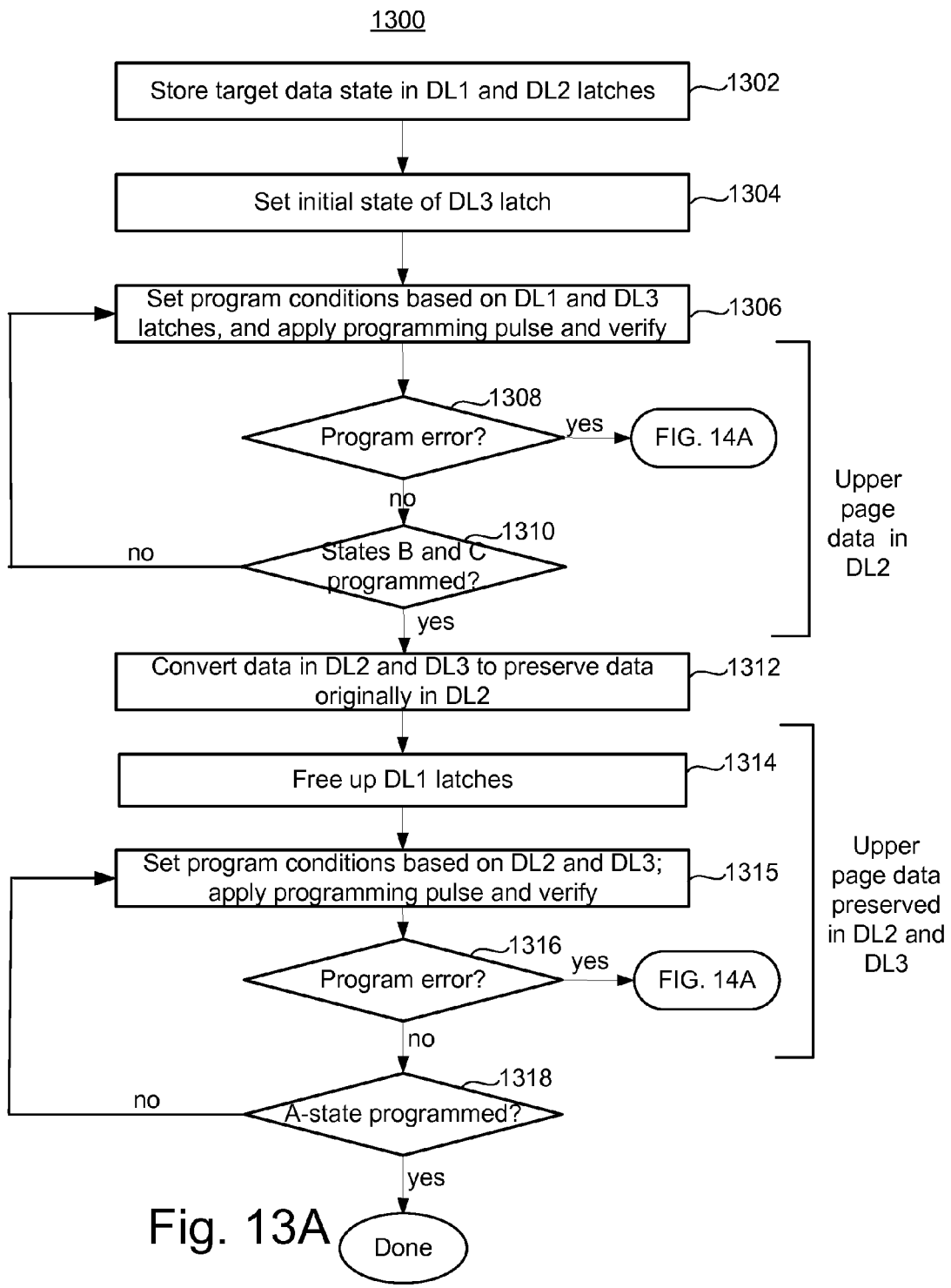
FIG. 13A is a flowchart of one embodiment of a process of operating data latches while programming and verifying non-volatile storage.

FIG. 13A is a flowchart of one embodiment of a process 1300 of operating data latches while programming and verifying non-volatile storage. Process 1300 provides further details of using the data latches differently depending on the stage of the programming process. For at least a portion of process 1300, the DL2 and DL3 latches are used for both verify status and to preserve upper page data. In process 1300, a programming sequence in which the B- and C-states are programmed prior to starting to program the A-state is used. FIGS. 7A-7C show one example of such a programming sequence. Note that process 1300 covers programming after a first programming pass depicted in FIG. 7A has been performed. Therefore, the B-state and C-state storage elements may be in the LM state 705 prior to process 1300. Note that A-state storage elements are still in the erased (Er) state 700 at the beginning of process 1300.

Figures 13B, 13E, 13F:
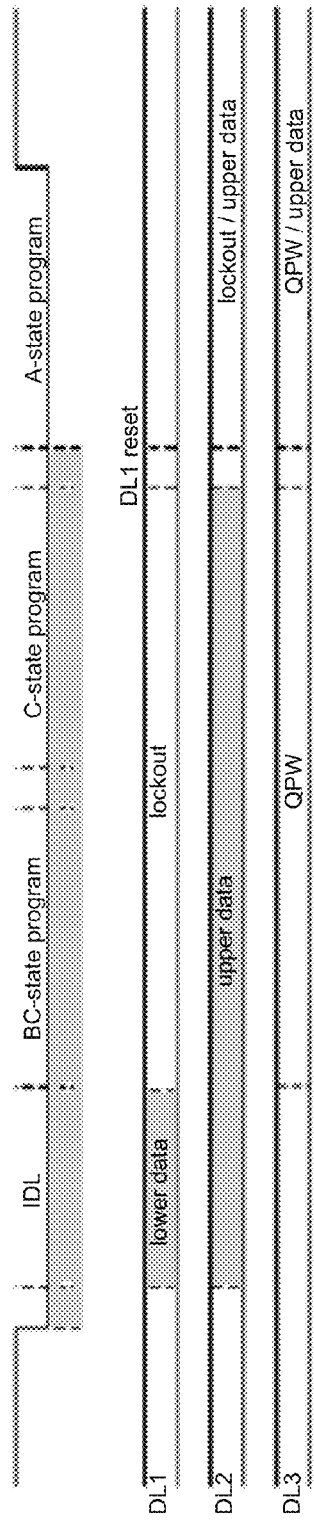
FIG. 13B shows data latch usage during one embodiment of programming that programs the B- and C-states first.
FIG. 13E shows a table of one embodiment of latch use during BC-state programming.
FIG. 13F shows a table of one embodiment of latch use during C-state programming.

FIG. 13B shows data latch usage during one embodiment of programming that programs the B- and C-states first. Note that this is divided into multiple stages. There is an internal data load (IDL), BC-state program, C-state program, and A-state program. Note that during the A-state program stage the DL2 latch is being used for both lockout status and for upper page data. Note that during the A-state program stage the DL3 latch is being used for both QPW status and for upper page data. Note that by both the DL2 and Dl3 latches being used for upper page data, it is meant that the upper page data can be recovered by some logical operation on the DL2 and DL3 latches.

In step 1302, the target data states are stored in latches. FIG. 13C shows target data stored in the DL1 and DL2 latches. The DL1 data is lower page data, and the DL2 data is upper page data, in one embodiment. As noted, there may be one DL1 and one DL2 latch associated with each non-volatile storage element to be programmed.

In step 1304, the initial state of the DL3 latches are set. In this embodiment, the initial state for storage elements to remain in the erased state is set to "1." The DL3 latch for all other storage elements is set to "0." FIG. 13D shows a table of initial states of the DL1, DL2 and DL3 latches for memory cells targeted for various states. In one embodiment, the DL3 latches are set by a logical AND operation of the original contents of the DL1 and DL2 latches. Steps 1302 and 1304 may occur during the IDL (internal data load) stage (see FIG. 13B).

In step 1306, one or more programming pulses are applied based on the data in the DL1 and DL3 latches, followed by verifying one or more states. For purposes of discussion, it will be assumed that programming is in the BC-state shown in FIG. 13B. Note that in one embodiment it is not necessary to examine the data in the DL2 latch to set the program conditions in step 1306. In one embodiment, full speed programming is used (e.g., bit line set to 0V) if the DL1 and DL3 latches are both zero. In one embodiment, slower speed programming is used (e.g., bit line set to intermediate voltage between 0V and Vdd) if the DL1 latch is zero and the DL3 latch is "1". In one embodiment, programming is inhibited (e.g., bit line set to Vdd) if the DL1 latch is "1" (regardless of state of DL3). Note that step 1306 is for programming storage elements to the B-state and C-state. Other storage elements will be locked out because their DL1 latch was set to "1" in step 1302.

Step 1306 also includes one or more verify operations. When a storage element passes verify, the verify status may be stored in one or more of the latches DL1, DL2, DL3. In one embodiment, storage elements to be programmed to the B-state are tested for verify low (e.g., VvbL) and verify high (e.g., Vvb). In one embodiment, storage elements to be programmed to the C-state are tested for verify low (e.g., VvcL) and verify high (e.g., Vvc). If a storage element passes verify low, then its DL3 latch is set to "1". If a storage element passes verify high (e.g., Vvb), then both its DL1 and DL3 latches are set to "1". In this example, the DL2 latch is not used at this point to store verify status. Note that at this stage the DL2 latch may be used to distinguish between B- and C-state storage elements.

If a program error occurs while programming the B- and C-states (step 1308), then a program data recovery process is performed. In one embodiment, upper page data may be recovered at this stage by reading the DL2 latches. FIG. 14B shows one embodiment of a data recovery process in which upper page data is recovered. FIG. 14C shows one embodiment of a data recovery process in which lower page data is recovered. These processes will be discussed below.

In step 1310, a determination is made whether storage elements targeted for states B and C are programmed. Note that it is not required that every storage element targeted for these states reaches its intended state. In one embodiment, some storage elements may be left under-programmed. If programming of the B- and C-states is not yet complete, the process returns to step 1306.

Note that the B-state storage elements could complete programming prior to the C-state storage elements. If so, then the programming proceeds from the BC-state program to the C-state program (see FIG. 13B). Latch use during C-state programming may be similar to BC-state programming. For example, in step 1306, the DL1 and DL3 latches may be used as previously described. In this case, B-state storage elements should have their DL1 latches set to "1," which locks them out from further programming. Likewise, verify operation may use the latches in a similar manner. However, there is no need to verify B-state storage elements. Therefore, time may be saved.

FIG. 13E shows a table of latch use during BC-state programming. FIG. 13F shows a table of latch use during C-state programming. Note that during BC-state programming there are eight possible states, as shown by the eight columns. However, during C-state programming there are six possible states because the program and QPW is no longer a possibility for B-state storage elements (e.g., B-cells).

When storage elements targeted for the B- and C-states are programmed, the data in the DL2 and DL3 latches are converted to preserve the DL2 data, in step 1312. FIG. 13G shows one embodiment of a table of the state of the latches at the end of C-state programming. Note that there are only four possible states at this point. FIG. 13H shows one embodiment of a first conversion step in which the logical operation of [(NOT DL2) AND DL3] is performed, with the result being stored in DL3. FIG. 13I shows one embodiment of a second conversion step in which the logical operation of [DL2 OR DL3] is performed, with the result being stored in DL2. Note that this second step is performed using the converted data in DL3 from the first step. Together, steps one and two serve to preserve the original program data that was stored in DL2 within a combination of DL2 and DL3. Therefore, the original program data from DL2 may be recovered by performing a suitable logical operation on the contents of DL2 and DL3.

In step 1314, the DL1 latches are freed up. Because the DL1 latches are free, they may be used for background caching, as one example. Further details of using data latches that are freed up during a program operation are described in U.S. Pat. No. 7,502,260, entitled "Method for Non-Volatile Memory with Background Data Latch Caching Operations During Program Operations, to Li et al., which is hereby incorporated in its entirety for all purposes.

Note that after the DL1 latches are freed up, programming proceeds with the A-state (see FIG. 13B). At this time, the DL2 and DL3 latches may be used to store the verify status, in one embodiment. Referring to FIG. 13B, the DL2 latches may be used for lockout status, and the DL3 latches may be used for QPW status. Also, only the DL2 and DL3 latches are needed to contain the information needed to uniquely define which state a storage element is being programmed to, in one embodiment.

When determining how to apply programming conditions (step 1315 of FIG. 13A), the status of the DL2 and DL3 latches may be used. In one embodiment, full speed programming is used (e.g., bit line set to 0V) if the DL2 and DL3 latches are both zero. In one embodiment, slower speed programming is used (e.g., bit line set to intermediate voltage between 0V and Vdd) if the DL2 latch is zero and the DL3 latch is "1". In one embodiment, programming is inhibited (e.g., bit line set to Vdd) if the DL2 latch is "1" (regardless of state of DL3). Note that step 1315 is for programming storage elements to the A-state. Other storage elements will be locked out because their DL2 latch should be at "1" at this stage of the programming.

Step 1315 also includes one or more verify operations. When a storage element passes verify, the verify status may be stored in one or more of the latches DL2 and DL3. In one embodiment, storage elements to be programmed to the A-state are tested for verify low (e.g., VvaL) and verify high (e.g., Vva). If a storage element passes verify low, then its DL3 latch is set to "1". If a storage element passes verify high, then both its DL2 and DL3 latches are set to "1". In this example, the DL1 latch is not used at this point to store verify status. As noted, the DL1 latches may be freed up at this point.

If a program error occurs while programming the A-state (step 1316), then a program data recovery process is performed. In one embodiment, the recovery involves performing a logical operation on the contents of the DL2 and DL3 latches. FIG. 14B shows one embodiment of a data recovery process in which upper page data is recovered. FIG. 14C shows one embodiment of a data recovery process in which lower page data is recovered. These processes will be discussed below.

In step 1318, a determination is made whether the A-state is programmed. If not, the process continues to program and verify (returning to step 1315), using the status of latches DL2 and DL3.

FIG. 14A is a flowchart of one embodiment of a process of recovering program data. The process may be used for either upper or lower page data. The process may be used if a program error is detected in step 1308 or 1316 of process 1300 of FIG. 13A. In step 1400 a determination is made whether upper page or lower page data is to be recovered. If upper page data is to be recovered, the process of FIG. 14B may be performed. If lower page data is to be recovered, then the process of FIG. 14C may be performed.

FIG. 14B is a flowchart of one embodiment of a process of recovering upper page program data. The process may be used if step 1308 or step 1316 from FIG. 13A detected a program error. Recall that step 1308 detected a program error prior to completion of programming the C-state. Step 1316 detected a program error after completion of programming the C-state. Recall that in FIG. 13A, the programming sequence was to program the B- and C-state first, then to program the A-state. The process of FIG. 14B is one embodiment of step 1112 from FIG. 11.

In step 1402 a determination is made whether B-state and C-state programming is complete. Note that in one embodiment, there is a BC-state program stage and a C-state program stage. A determination is made of whether the C-state program stage is complete, in one embodiment of step 1402. If B-state and C-state programming is complete, a logical operation is performed on the present data in the DL2 and DL3 latches to recover the original program data that was stored in the DL2 latches, in step 1404. In one embodiment, the logical operation is [NOT ((NOT DL2) OR DL3)]. In step 1406, the result is stored to DL2. In step 1408, the data from DL2 is read out to recover the original program data stored to DL2. In one embodiment, this recovers upper page data.

If step 1402 determined that the B-state and C-state programming is not complete at the time the program error was detected, then step 1410 is performed to recover the data. In step 1410, the present data in the DL2 latches is read out to recover the original program data stored to DL2. Thus, in this scenario a logical operation does not need to be performed on the data in DL2 and DL3 to recover the program data.

Note that if the B-state and C-states have not completed programming, this means that the data conversion of step 1312 from FIG. 13A has not yet been performed. However, if the B- and C-states have been programmed, then the error was detected in step 1316, in one embodiment. Therefore, the data conversion of step 1312 was performed in this scenario. Therefore, testing whether the B- and C-states have finished programming tests whether the data conversion of step 1312 was performed, in one embodiment. Additionally, it will be understood that the process of FIG. 14B is one embodiment of FIG. 12B.

FIG. 14C is a flowchart of one embodiment of a process of recovering lower page program data. The process may be used if step 1308 or step 1316 from FIG. 13A detected a program error. Note that recovering lower page data in FIG. 14C is somewhat different from recovering upper page data in FIG. 14B. Specifically, the DL2 and DL3 latches are not necessarily used to recover the data in FIG. 14C.

In step 1422 a determination is made whether B- and C-state programming is complete. If so, the non-volatile storage elements are read at the B-read level. Note that if the B- and C-states are complete, then the third pass is underway (see FIG. 7C). This means that the B-state should be programmed to distribution 704, and the C-state should be programmed to distribution 706. Therefore, reading at Vrb (see FIG. 6A) should distinguish between an element being in either the Er and A-state group or the B- and C-state group. In one embodiment, this recovers lower page data.

If step 1422 determined that the B and C-states were not finished programming at the time the program error was detected, then step 1424 is performed to recover the data. In one embodiment of step 1422, a read is performed at a level between VvLM (see FIG. 6B) and an upper bound of the Er-state Vth budget. Note that in this case all of the B-state and C-state storage elements should be at least to the level VvLM due to the first programming pass (FIG. 6B). However, all of the A-state and Er-state storage elements should still be in the Er-state. Therefore, lower page data may be recovered.

In one embodiment, the lower page data is recovered in response to a program error during upper page programming. However, the lower page data may be recovered in cases other than a program error. In one embodiment, the lower page data is recovered as part of a lower page read that is performed prior to completion of a second programming pass. For example, the lower page read may be used prior to completion of the second programming pass of FIG. 6C or FIG. 7B. In one embodiment, the lower page data is recovered as part of a lower page read that is performed prior to completion of a third programming pass. For example, the lower page read may be used prior to completion of the third programming pass of FIG. 7C. In one embodiment, the lower page data is recovered as part of an internal data loading (IDL) for a lower page.

As noted herein, some embodiments make use of a quick pass write (QPW) or slow programming mode when a storage element is near its target threshold voltage level. For example, verify low levels such as Vval, VvbL, and VvcL may be used. In one embodiment, QPW is used for A-, B-, and C-states. In one embodiment, QPW is used for A- and B-states, but not for the C-state. More generally, in some embodiments, QPW is not used for the highest data state. When programming three bits per storage element, this would be the G-state.

Figures 15A, 15B, 15C:
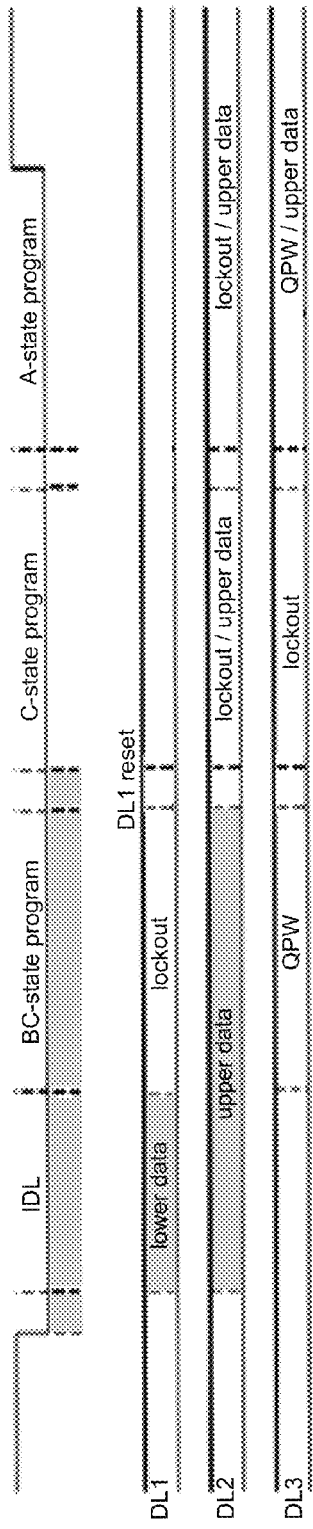
FIG. 15A shows data cache usage for one embodiment of a programming sequence.
FIG. 15B shows one embodiment of data states for the programming sequence used in FIG. 15A.
FIG. 15C shows a table of one embodiment of latch usage when programming the C-state when QPW is not used for the C-state.

Note that QPW may be used for the C-state for the examples discussed in connection with FIG. 13A. The following describes one embodiment in which QPW is not used for the C-state. Reference will be made to the BC-state programming sequence of FIG. 13A to discuss differences when QPW is not used for the C-state. FIG. 15A shows data cache usage for one embodiment of a programming sequence that is similar to the one of FIG. 13B. However, data latch usage is different for the C-state program stage. The DL1 latches are free during the C-state program. The DL2 latches are used for lockout status and upper page data during the C-state program. The DL3 latches are used for lockout status during the C-state program.

Step 1304 of FIG. 13A, which sets up the DL3 latches may be the same as previously described. Data cache usage may be as indicated in the table of FIG. 15B. Note that there are only seven states instead of eight states when QPW is used for the C-state.

Recall that in step 1306, one or more programming pulses are applied based on the data in the DL1 and DL3 latches, followed by verifying one or more states. Also recall that programming may be divided into a BC-state stage and a C-state stage (see FIG. 15A). The following describes one embodiment of BC-state stage when QPW is not used for the C-state. In one embodiment, full speed programming is used (e.g., bit line set to 0V) if the DL1 and DL3 latches are both zero. In one embodiment, slower speed programming is used (e.g., bit line set to intermediate voltage between 0V and Vdd) if the DL1 latch is zero and the DL3 latch is "1". In one embodiment, programming is inhibited (e.g., bit line set to Vdd) if the DL1 latch is "1" (regardless of state of DL3). Note that this may be the same as for when QPW is used for the C-state.

Recall that step 1306 also includes one or more verify operations. When a storage element passes verify, the verify status may be stored in one or more of the latches DL1, DL2, DL3. In one embodiment, storage elements to be programmed to the B-state are tested for verify low (e.g., VvbL) and verify high (e.g., Vvb). In one embodiment in which QPW is not used for the C-state, storage elements to be programmed to the C-state are tested for verify high (e.g., Vvc). If a B-state storage element passes verify low, then its DL3 latch is set to "1". If a B- or C-state storage element passes verify high (e.g., Vvb or Vvc), then both its DL1 and DL3 latches are set to "1".

FIG. 15C shows a table of one embodiment of latch usage when programming the C-state when QPW is not used for the C-state. Note that there are five unique states (program and QPW is not valid for B-cells). As noted, the B-state storage elements could complete programming prior to the C-state storage elements. If so, then the programming proceeds from the BC-state program to the C-state program (see FIG. 15A). In step 1306, the DL2 and DL3 latches may be used. In one embodiment, full speed programming is used (e.g., bit line set to 0V) if the DL2 is "1" and DL3 is "0." Slower speed programming is not used in this stage when QPW is not used for C-state. In one embodiment, programming is inhibited (e.g., bit line set to Vdd) for all storage elements except those that are being programmed.

Recall that step 1306 also includes one or more verify operations. The following describes one embodiment of verify during C-state programming when QPW is not used for the C-state (for the programming sequence of BC-state first). Storage elements to be programmed to the C-state are tested for verify high (e.g., Vvc). If a C-state storage element passes verify high (e.g., Vvc), then its DL3 latch is set to "1".

The data conversion step (e.g., 1312) may be the same as previously described for the example in which QPW is used for the C-state. A-state programming and verify may be the same as the example in which QPW is used for the C-state. Upper page data recovery may be the same as the example in which QPW is used for the C-state. Thus, the embodiment described in FIG. 14A may be used when QPW is used for the C-state, and it may also be used when QPW is not used for the C-state.

Now that some embodiments in which the B- and C-states are programmed first have been described, some embodiments in which first the C-state is programmed will be discussed. FIGS. 8A-8C show one embodiment of such a programming sequence.

Figure 16A:
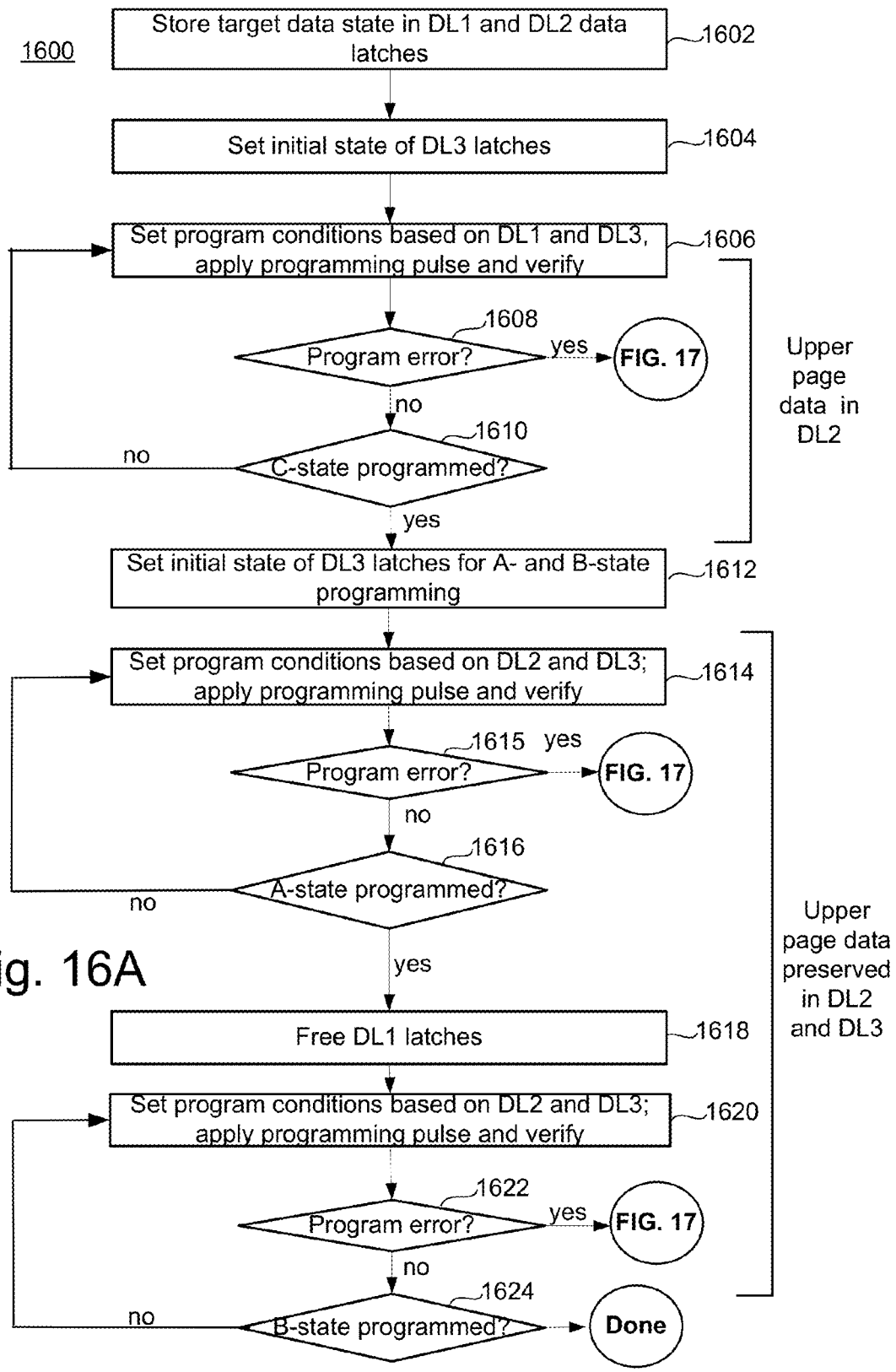
FIG. 16A is a flowchart of one embodiment of a process of operating data latches while programming and verifying non-volatile storage.

FIG. 16A is a flowchart of one embodiment of a process 1600 of operating data latches while programming and verifying non-volatile storage. Process 1600 provides further details of using the data latches differently depending on the stage of the programming process. For at least a portion of process 1600, the DL2 and DL3 latches are used for both verify status and to preserve upper page data. In process 1600, a programming sequence is used in which the C-state is programmed in a second pass (e.g., FIG. 8B) prior to starting to program the A- and B-states (e.g., FIG. 8C).

Figures 16B, 16C, 16D:
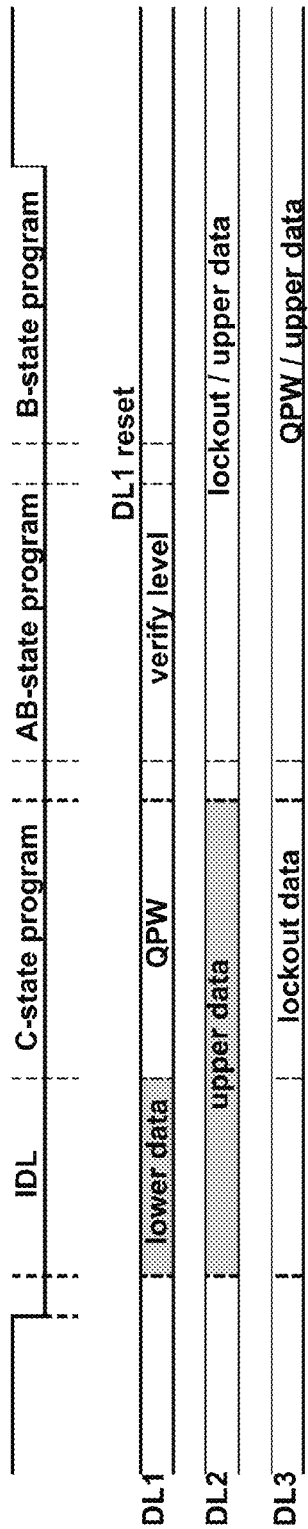
FIG. 16B shows data latch usage during one embodiment of programming that programs the C-state first.
FIG. 16C shows target data stored in the DL1 and DL2 latches.
FIG. 16D shows a table of one embodiment of initial states of the DL1, DL2 and DL3 for the process of FIG. 16A.

FIG. 16B shows data latch usage during one embodiment of programming that programs the C-state first. Note that this is divided into multiple stages. There is an internal data load (IDL), C-state program, AB-state program, and B-state program. During the C-state program stage, the DL1 and DL3 latches are used for verify status. In one embodiment, the DL1 latch is used for QPW status and the DL3 latch is used for lockout status during C-state program. In one embodiment, the DL3 latch is used for QPW status and the DL1 latch is used for lockout status during C-state program. The DL2 latches store the upper page data during C-state program. During AB state program stage, the DL2 and DL3 latches are used for verify status and also for preserving upper page data. The DL1 latches are used for verify level during AB state program stage. During B-state program stage, the DL1 latches are free. The DL2 and DL3 latches are used for verify status and also for preserving upper page data during the B-state program stage.

In step 1602, the target data states are stored in latches. FIG. 16C shows target data stored in the DL1 and DL2 latches. The DL1 data is lower page data, and the DL2 data is upper page data, in one embodiment. As noted, there may be one DL1 and one DL2 latch associated with each non-volatile storage element to be programmed.

In step 1604, the initial state of the DL3 latches are set. In this embodiment, the initial state for storage elements to remain in the erased state, those to be programmed to the A-state and the B-state are all set to "1." The DL3 latch for C-state storage elements is set to "0." FIG. 16D shows a table of one embodiment of initial states of the DL1, DL2 and DL3 latches for memory cells targeted for various states. In one embodiment, the DL3 latches are set by a logical operation of the original contents of the DL1 and DL2 latches. This may be [(NOT DL2) OR DL1], with the results being stored in DL3. Steps 1602 and 1604 may occur during the IDL (internal data load) stage (see FIG. 16B).

In step 1606, one or more programming pulses are applied based on the data in one or more of the latches, followed by verifying one or more states. In one embodiment, program conditions are set based on the state of DL1 and DL3 latches. As noted, initially only the C-state is undergoing programming. FIG. 16E shows a table of one embodiment of latch use during the C-state programming in which there are six possible states. In one embodiment, full speed programming is used (e.g., bit line set to 0V) if the DL1 and DL3 latches are both zero. In one embodiment, slower speed programming is used (e.g., bit line set to intermediate voltage between 0V and Vdd) if the DL1 latch is "1" and the DL3 latch is "0". In one embodiment, programming is inhibited (e.g., bit line set to Vdd) if the DL3 latch is "1" (regardless of state of DL1). Note that the state of the DL2 latch is not used in the foregoing. Note that step 1606 is for programming storage elements to the C-state. Other storage elements will be locked out because their DL3 latch was set to "1" in step 1604.

Step 1606 also includes one or more verify operations. When a storage element passes verify, the verify status may be stored in one or more of the latches. In one embodiment, storage elements to be programmed to the C-state are tested for verify low (e.g., VvcL) and verify high (e.g., Vvc). If a storage element passes verify low, then its DL1 latch is set to "1". If a storage element passes verify high (e.g., Vvc), then both its DL1 and DL3 latches are set to "1". Note that in this example, the DL1 latches are used for QPW status, and the DL3 latches are used for lockout status. In another embodiment, this latch usage is reversed such that the DL3 latches are used for QPW status, and the DL1 latches are used for lockout status. In step 1606, the DL2 latches do not need to be used to store verify status. The DL2 latch should be "1" for C-state storage elements regardless of their programming status, in one embodiment.

Figure 17:
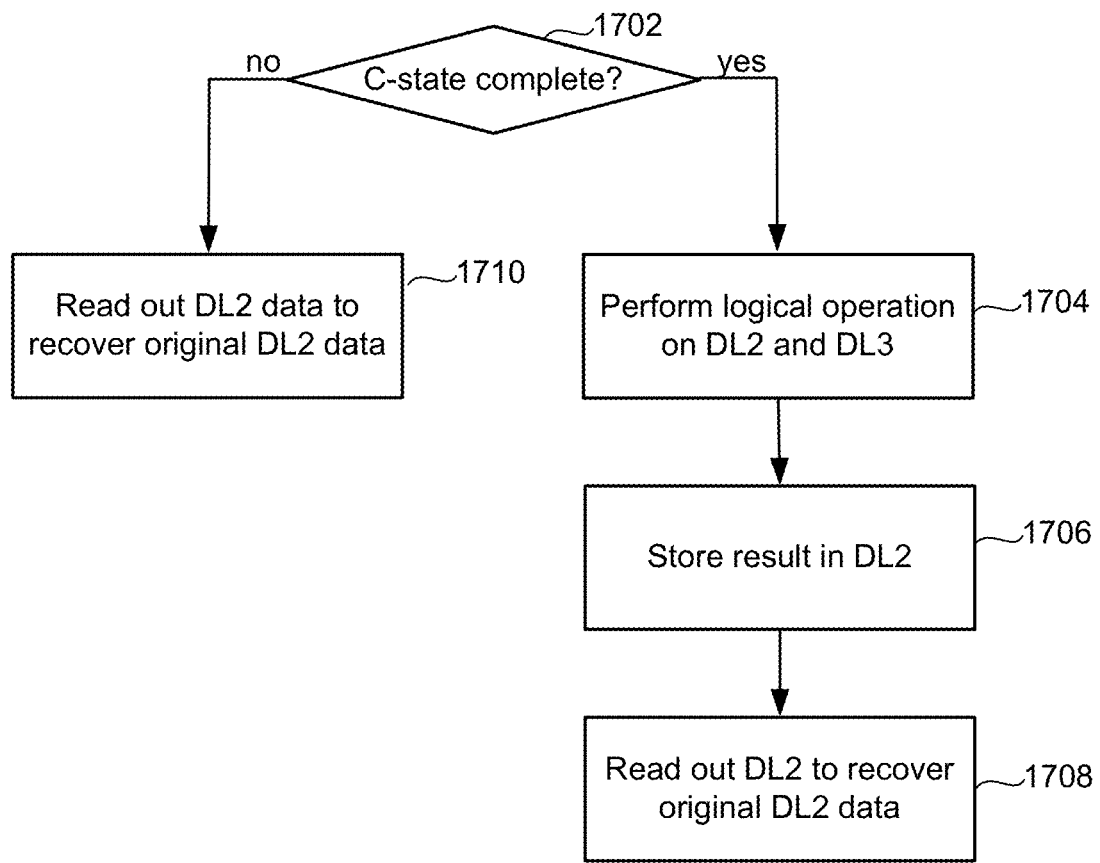
FIG. 17 shows one embodiment of a data recovery process in which upper page data is recovered.

If a program error occurs while programming the C-state (step 1608), then a program data recovery process is performed. In one embodiment, upper page data is recovered at this point by reading out the DL2 latches. FIG. 17 shows one embodiment of a data recovery process in which upper page data is recovered that may be used following step 1608. FIG. 17 will be discussed below.

In step 1610, a determination is made whether storage elements targeted for the C-state are programmed. Note that it is not required that every storage element targeted for the C-state reaches its verify threshold voltage. In one embodiment, some storage elements may be left under-programmed. If programming of the C-state is not yet complete, the process returns to step 1606.

When storage elements targeted for the C-state are programmed, the data in the DL3 latches are set up for A- and B-state programming, in step 1612. FIG. 16F shows a table of the state of the latches at the end of C-state programming. Note that there are only four possible states at this point. FIG. 16G shows a step in which the DL3 latches are set to "0".

In step 1614, program conditions are applied based on the latches. Initially, both the A- and B-states may be programmed together. The following will assume both states are being programmed. FIG. 16H shows a table of the eight possible states during one embodiment of the AB-state stage of programming. Note that during AB-state programming, the DL2 latches are used for verify status. Therefore, the upper page data cannot be recovered by simply reading out the DL2 latches. Specifically, the A- and B-state storage elements will have their DL2 latches set to "1" when they are locked out from further programming. However, the upper page data can be fully recovered from data in the combination of the DL2 and DL3 latches.

In one embodiment, full speed programming is used (e.g., bit line set to 0V) if the DL2 and DL3 latches are both zero. In one embodiment, slower speed programming is used (e.g., bit line set to intermediate voltage between 0V and Vdd) if the DL2 latch is zero and the DL3 latch is "1". In one embodiment, programming is inhibited (e.g., bit line set to Vdd) if the DL2 latch is "1" (regardless of state of DL3).

Step 1614 also includes one or more verify operations. When a storage element passes verify, the verify status may be stored in one or more of the latches. In one embodiment, the DL1 latches are used to store a verify level. This may be used to indicate whether a storage element is to be verified for the A-level or the B-level. For example, a value of "1" could indicate that this is an A-state storage element, whereas a value of "0" could indicate that this is a B-state storage element.

In one embodiment, storage elements to be programmed to the A-state are tested for verify low (e.g., VvaL) and verify high (e.g., Vva). If an A-state storage element passes verify low, then its DL3 latch is set to "1". If an A-state storage element storage element passes verify high, then both its DL2 and DL3 latches are set to "1". In this example, the DL1 latch for A-state storage elements is used for a verify level, as opposed to verify status.

B-state storage elements may also be verified in step 1614. In one embodiment, storage elements to be programmed to the B-state are tested for verify low (e.g., VvbL) and verify high (e.g., Vvb). If a B-state storage element passes verify low, then its DL3 latch is set to "1". If a B-state storage element storage element passes verify high, then its DL2 and DL3 latches are set to "1". In this example, the DL1 latch for B-state storage elements is used for a verify level, as opposed to verify status.

If a program error occurs while programming the A- and B-states (step 1615), then a program data recovery process is performed. In one embodiment, upper page data is recovered based on data in both the DL2 and DL3 latches. FIG. 17 shows one embodiment of a data recovery process in which upper page data is recovered.

Note that the A-state storage elements could complete programming prior to the B-state storage elements. In step 1616, a determination is made whether the A-state is programmed. If not, the process continues to program and verify (returning to step 1614), using the status of latches DL2 and DL3. When the A-state programming is complete, programming may proceed to a B-state stage (FIG. 16B). In this case, the DL1 latches may be free in step 1618. FIG. 16I shows a table of the six possible states during one embodiment of the B-state stage of programming.

In step 1620, programming conditions are set based on the state of latches. In one embodiment, DL2 and DL3 latches are used for program conditions in step 1620. In one embodiment, full speed programming is used (e.g., bit line set to 0V) if the DL2 and DL3 latches are both zero. In one embodiment, slower speed programming is used (e.g., bit line set to intermediate voltage between 0V and Vdd) if the DL2 latch is zero and the DL3 latch is "1". In one embodiment, programming is inhibited (e.g., bit line set to Vdd) if the DL2 latch is "1" (regardless of state of DL3). Note that in step the status of the DL1 latch does not need to be used.

Step 1620 also includes one or more verify operations. In one embodiment, storage elements to be programmed to the B-state are tested for verify low (e.g., VvbL) and verify high (e.g., Vvb). If a B-state storage element passes verify low, then its DL3 latch is set to "1". If a B-state storage element storage element passes verify high, then its DL2 and DL3 latches are set to "1", in one embodiment.

If a program error occurs while programming the B-state (step 1622), then a program data recovery process is performed. In one embodiment, upper page data is recovered based on data preserved in the DL2 and DL3 latches. FIG. 17 shows one embodiment of a data recovery process in which upper page data is recovered. When programming of the B-state is complete (step 1624), the process concludes.

FIG. 17 is a flowchart of one embodiment of a process of recovering upper page program data. The process may be used if steps 1608, 1615, or step 1622 from FIG. 16A detected a program error. Recall that step 1608 detected a program error prior to completion of programming the C-state. Steps 1615 and 1622 detected a program error after completion of programming the C-state. Recall that in FIG. 16A, the programming sequence was to program the C-state first, then to program the A- and B-states. The process of FIG. 17 is one embodiment of step 1112 from FIG. 11. The process of FIG. 17 is one embodiment of the process of FIG. 12C.

In step 1702 a determination is made whether C-state programming is complete. Note that testing for C-state completion (step 1702) is one embodiment of step 1240 from FIG. 12C.

If C-state programming is complete, a logical operation is performed on the present data in the DL2 and DL3 latches to recover the original program data that was stored in the DL2 latches, in step 1704. In one embodiment, the logical operation is [NOT ((NOT DL2) OR DL3)]. In step 1706, the result is stored to DL2. In step 1708, the data from DL2 is read out to recover the original program data stored to DL2. In one embodiment, this recovers upper page data.

If step 1702 determined that the C-state was not finished programming at the time the program error was detected, then step 1710 is performed to recover the data. In step 1710, the present data in the DL2 latches is read out to recover the original program data stored to DL2. Thus, in this scenario a logical operation does not need to be performed on the data in DL2 and DL3 to recover the program data.

In some embodiments, the A-, B-, and C-states are all programmed in the same programming pass. In one embodiment, in a first programming cells are programmed to a lower middle state (e.g., FIG. 6B). Then, cells are programmed from the Er-state to the A-state, while others are programmed from the LM state to either the B- or C-state (e.g., FIG. 6C). In another programming sequence, cells are programmed from the Er-state directly to the A-, B-, and C-states (e.g., FIGS. 9A and 9B). FIG. 18A is a flowchart of one embodiment of a process 1800 in which the A-, B-, and C-states are all programmed in the same programming pass. FIG. 18B is a diagram that shows latch usage during one embodiment of the process of FIG. 18A. Note that the programming scheme of FIG. 18B is divided into multiple stages. In one embodiment (e.g. FIGS. 6B and 6C), there is an internal data load (IDL), ABC-state program, BC-state program, and C-state program. One embodiment (e.g. FIGS. 9A and 9B) does not have an internal data load (IDL) since a flash memory controller will issue lower and upper page data prior to each programming pass. Thus, in one embodiment there is ABC-state program, BC-state program, and C-state program. During both the ABC-state stage and the BC-state stage, the DL2 and DL3 latches are used for both verify status and for preserving upper page data. During the C-state program, the DL2 latches restore the upper page data. During the C-state program, the DL3 latches are used for verify status.

In step 1802, the target data states are stored in latches. FIG. 18C shows target data stored in the DL1 and DL2 latches. The DL1 data is lower page data, and the DL2 data is upper page data, in one embodiment. As noted, there may be one DL1 and one DL2 latch associated with each non-volatile storage element to be programmed.

In step 1804, the initial state of the DL3 latches are set. In this embodiment, the initial DL3 values for all states is set to "0." FIG. 18D shows a table of initial states of the DL1, DL2 and DL3 latches for memory cells targeted for various states for one embodiment of the process of FIG. 18A. Steps 1802 and 1804 may occur during the IDL (internal data load) stage (see FIG. 18B).

In step 1806, program conditions are set based on the status of the latches. FIG. 18E shows a table of latch use during one embodiment of ABC-state programming in which there are nine possible states. One or more programming pulses are applied based on the data in one or more of the latches, followed by verifying one or more states. As noted, initially the A-, B-, and C-states are undergoing programming. In one embodiment, the DL1 and DL2 latches are used for lockout status and the DL3 latches are used for QPW status. In one embodiment, full speed programming is used (e.g., bit line set to 0V) if the DL1 and DL2 latches are NOT "11" and the DL3 latch is "0". In one embodiment, slower speed programming is used (e.g., bit line set to intermediate voltage between 0V and Vdd) if the DL1 and DL2 latches are NOT "11" and the DL3 latch is "1". In one embodiment, programming is inhibited (e.g., bit line set to Vdd) if the DL1 latch is "1" and the DL2 latch is "1" (regardless of state of DL3).

Step 1806 also includes one or more verify operations. When a storage element passes verify, the verify status may be stored in one or more of the latches. In one embodiment, storage elements to be programmed to the A-state are tested for verify low (e.g., VvaL) and verify high (e.g., Vva). If an A-state storage element passes verify low, then its DL3 latch is set to "1". If an A-state storage element passes verify high, then both its DL2 and DL3 latches are set to "1".

In one embodiment, storage elements to be programmed to the B-state are tested for verify low (e.g., VvbL) and verify high (e.g., Vvb). If a B-state storage element passes verify low, then its DL3 latch is set to "1". If a B-state storage element passes verify high, then its DL1, DL2 and DL3 latches are all set to "1".

In one embodiment, storage elements to be programmed to the C-state are tested for verify high (e.g., Vvc). If a C-state storage element passes verify high, then its DL1 latch is set to "1". In one embodiment, C-state cells are not tested for verify low.

Figure 19:
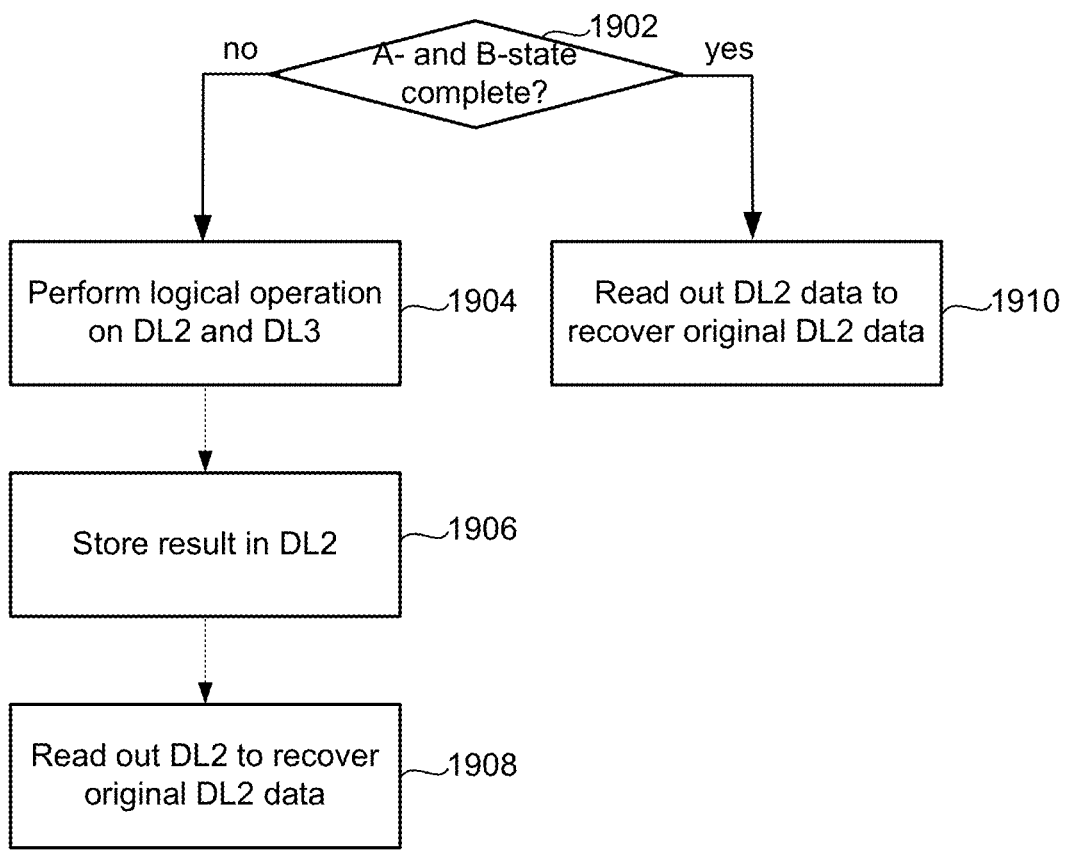
FIG. 19 shows one embodiment of a data recovery process in which upper page data is recovered.

If a program error occurs while in the ABC-state program stage (step 1808), then a program data recovery process is performed. In one embodiment, upper page data is recovered based on data in both the DL2 and DL3 latches. FIG. 19 shows one embodiment of a data recovery process in which upper page data is recovered that may be used following step 1808.

In step 1810, a determination is made whether storage elements targeted for the A-state are programmed. Note that it is not required that every storage element targeted for these states reaches its intended state. In one embodiment, some storage elements may be left under-programmed. If programming of the A-state is not yet complete, the process returns to step 1806.

When storage elements targeted for the A-state are programmed, the process goes on to the BC-state program stage (FIG. 18B). FIG. 18F shows a table of the latch usage during one embodiment of the BC-state program stage. Note that there are seven different possible states, as the program and QPW states for the A-state are not needed.

In step 1812, program conditions are applied based on the latches. In one embodiment, full speed programming is used (e.g., bit line set to 0V) if the DL1 and DL2 latches are NOT "11" and the DL3 latch is "0". In one embodiment, slower speed programming is used (e.g., bit line set to intermediate voltage between 0V and Vdd) if the DL1 and DL2 latches are NOT "11" and the DL3 latch is "1". In one embodiment, programming is inhibited (e.g., bit line set to Vdd) if the DL1 latch is "1" and the DL2 latch is "1" (regardless of state of DL3).

Step 1812 also includes one or more verify operations. When a storage element passes verify, the verify status may be stored in one or more of the latches. In one embodiment, storage elements to be programmed to the B-state are tested for verify low (e.g., VvbL) and verify high (e.g., Vvb). If a B-state storage element passes verify low, then its DL3 latch is set to "1". If a B-state storage element passes verify high, then its DL1, DL2 and DL3 latches are all set to "1". In one embodiment, storage elements to be programmed to the C-state are tested for verify high (e.g., Vvc). If a C-state storage element passes verify high, then its DL1 latch is set to "1". In one embodiment, C-state cells are not tested for verify low.

If a program error occurs while programming the B- and C-states (step 1814), then a program data recovery process is performed. In one embodiment, upper page data is recovered based on data in both the DL2 and DL3 latches. FIG. 19 shows one embodiment of a data recovery process in which upper page data is recovered.

Note that the B-state storage elements could complete programming prior to the C-state storage elements. In step 1816, a determination is made whether the B-state is programmed. If not, the process continues to program and verify (returning to step 1812), using the status of the latches. When the B-state programming is complete, programming may proceed to a C-state program stage (FIG. 18B).

Note that during the programming of the A- and B-states, that the DL2 latches were used for verify status. Therefore, the original program data stored to the DL2 latches will no longer be recoverable directly from the DL2 latches. However, the program data was preserved in the combination of the DL2 and DL3 latches.

In step 1818, the original program data is restored to the DL2 latches. In one embodiment, the original program data is restored to the status of the DL3 latches. FIG. 18G shows the state of the latches after one embodiment of the BC-state program stage.

FIG. 18H shows one embodiment of conversion of data in the DL2 latches. In one embodiment, the following logical operation is performed in step 1818 [NOT DL3→DL2]. In other words, the opposite of the contents of the DL3 latch is stored into the DL2 latch for each storage element. Then, the contents of the DL1 latch is stored into the DL3 latch for each storage element. FIG. 18I shows one embodiment of conversion of data in the DL3 latches. In step 1820, the DL1 latches may be freed.

Programming then proceeds with the C-state program stage (FIG. 18B). FIG. 18I shows a table of the five possible states during one embodiment of the C-state stage of programming. In step 1822, programming conditions are set based on the state of latches. In one embodiment, full speed programming is used (e.g., bit line set to 0V) if the DL3 latch for a storage element is "0". In one embodiment, slower speed programming is not used in the C-state program stage. In one embodiment, programming is inhibited (e.g., bit line set to Vdd) if the DL3 latch is "1". Note that in step the status of the DL2 latch does not need to be used, and the DL1 latch is freed.

Step 1822 also includes one or more verify operations. In one embodiment, storage elements to be programmed to the C-state are tested for verify high (e.g., Vvc). If a C-state storage element passes verify high, then its DL3 latch is set to "1".

If a program error occurs while programming the C-state (step 1824), then a program data recovery process is performed. In one embodiment, upper page data is recovered by reading out the DL2 latches. FIG. 19 shows one embodiment of a data recovery process in which upper page data is recovered. When programming of the C-state is complete (step 1826), the process concludes.

FIG. 19 is a flowchart of one embodiment of a process of recovering upper page program data. The process may be used if steps 1808, 1814, or 1824 from FIG. 18A detected a program error. Recall that steps 1808 and 1814 detected a program error prior to completion of programming the B-state. Step 1824 detected a program error after completion of programming the B-state.

In step 1902 a determination is made whether A- and B-state programming is complete. If not, a logical operation is performed on the present data in the DL2 and DL3 latches to recover the original program data that was stored in the DL2 latches, in steps 1904-1908. In step 1904, the logical operation is performed. In one embodiment, the logical operation is [NOT ((NOT DL2) OR DL3)]. In step 1906, the result is stored to DL2. In step 1908, the data from DL2 is read out to recover the original program data stored to DL2. In one embodiment, this recovers upper page data.

If step 1902 determined that the A- and B-states were finished programming at the time the program error was detected, then step 1910 is performed to recover the data. In step 1910, the present data in the DL2 latches is read out to recover the original program data stored to DL2. Thus, in this scenario a logical operation does not need to be performed on the data in DL2 and DL3 to recover the program data.

Note that if the A- and B-states have not completed programming, this means that the data restore of step 1818 from FIG. 18A has not yet been performed. However, if the A- and B-states have been programmed then the error was detected in step 1824, in one embodiment. Therefore, the data restore of step 1818 was performed in this scenario. Therefore, testing whether the A- and B-states have finished programming tests whether the data restore of step 1818 was performed, in one embodiment. Additionally, it will be understood that the process of FIG. 19 is one embodiment of FIG. 12D.

One embodiment includes a method for operating non-volatile storage in which data is recovered. A plurality of first bits are stored into a corresponding plurality of first latches. A plurality of second bits are stored into a corresponding plurality of second latches. The plurality of first bits and the plurality of second bits are programmed into a plurality of non-volatile storage elements. Each of the non-volatile storage elements is to be programmed with one of the plurality of first bits and one of the plurality of second bits. The plurality of second latches and a plurality of third latches are used for verify status when programming the non-volatile storage elements. The plurality of second bits are preserved within a combination of the plurality of second latches and the plurality of third latches while using the plurality of second latches and the plurality of third latches for verify status. The plurality of second bits are recovered in response to a program error during the programming. The recovering is based on data in at least the plurality of second latches.

In one embodiment, the preserving the plurality of second bits within a combination of the plurality of second latches and the plurality of third latches includes converting data in the plurality of second latches and the plurality of third latches during the programming to preserve the plurality of second bits within a combination of the plurality of second latches and the plurality of third latches.

In one embodiment, the recovering the plurality of second bits in response to a program error includes performing a logical operation on data in the plurality of second latches and the plurality of third latches.

In one embodiment, the method further comprises restoring the plurality of second bits to the plurality of second latches by performing a logical operation on data in the plurality of third latches prior to detecting the program error. In this event, the recovering the plurality of second bits in response to a program error includes reading data from the plurality of second latches in one embodiment.

One embodiment includes a non-volatile storage device comprising a plurality of non-volatile storage elements, a plurality of sets of latches, and one or more managing circuits in communication with the plurality of non-volatile storage elements and the plurality of sets of latches. Each set of latches is associated with one of the non-volatile storage elements. The set of latches associated with each non-volatile storage element includes a first latch, a second latch, and a third latch. The one or more managing circuits store a plurality of first bits into respective ones of the first latches. The one or more managing circuits store a plurality of second bits into respective ones of the second latches. The one or more managing circuits program the plurality of first bits and the plurality of second bits into the plurality of non-volatile storage elements. Each of the non-volatile storage elements is to be programmed with one of the plurality of first bits and one of the plurality of second bits. The one or more managing circuits store verify status in the plurality of second latches and the plurality of third latches while programming the non-volatile storage elements. The one or more managing circuits preserve the plurality of second bits within a combination of the plurality of second latches and the plurality of third latches while using the plurality of second latches and the plurality of third latches for verify status. The one or more managing circuits recover the plurality of second bits in response to a program error during the programming based on data in at least the plurality of second latches.

A method for operating non-volatile storage comprising the following. Lower page data is stored in a first set of latches. Upper page data is stored in a second set of latches. The lower page data and the upper page data is programmed into a plurality of non-volatile storage elements. The second set of latches and a third set of latches are used for verify status while programming the upper page data. The upper page data is preserved within a combination of the second set of latches and the third set of latches while using the second set of latches and a third set of latches for verify status. The upper page data is recovered in response to a program error during programming of the upper page data. The recovering includes performing a logical operation on data in the second set of latches and the third set of latches if the upper page data is being preserved within the combination of the second set of latches and the third set of latches when the program error was detected and reading the upper page from the second set of latches if the upper page data.

In one embodiment, the method of the previous paragraph further comprises restoring the upper page data to the second set of latches by performing a logical operation on data in the plurality of third latches prior to detecting the program error.

One embodiment includes a non-volatile storage device that is able to recover upper page data in response to detecting a program error. The device comprises a plurality of non-volatile storage elements arranged as NAND strings, a plurality of sets of latches, and one or more managing circuits in communication with the plurality of non-volatile storage elements and the plurality of sets of latches. Each set of latches is associated with one of the non-volatile storage elements. The set of latches associated with each non-volatile storage element includes a first latch for receiving program data, a second latch for receiving program data, and a third latch for storing verify status. The one or more managing circuits store lower page data in the first latches. The one or more managing circuits store upper page data in the second latches. The one or more managing circuits program the lower page data and the upper page data into the plurality of non-volatile storage elements. The one or more managing circuits record verify status in the second latches and the third latches while programming the upper page data. The one or more managing circuits preserve the upper page data within a combination of the second set of latches and the third set of latches while using the second set of latches and the third set of latches for verify status. The one or more managing circuits detect a program error while programming the upper page data. The one or more managing circuits recover the upper page data in response to detecting the program error. The recovering includes performing a logical operation on data in the second set of latches and the third set of latches if the upper page data is being preserved within the combination of the second set of latches and the third set of latches when the program error was detected.

In one embodiment, the one or more managing circuits of the previous paragraph restore the upper page data to the second set of latches by performing a logical operation on data in the plurality of third latches prior to detecting the program error.

One embodiment includes method for operating non-volatile storage comprising the following. Lower page data is stored in a first set of latches associated with a plurality of non-volatile storage elements arranged as NAND strings. Each of the non-volatile storage elements is associated with one of the latches in the first set. Upper page data is stored in a second set of latches. Each of the non-volatile storage elements is associated with one of the latches in the second set. A third set of latches are initialized. Each of the non-volatile storage elements is associated with one of the latches in the third set. The lower page data and the upper page data is programmed into the plurality of non-volatile storage elements. The programming includes programming to an A-state, a B-state, and a C-state. The programming of the B-state and the C-state is completed prior to starting to program the A-state. The second set of latches and a third set of latches are used for verify status at least while programming the upper page data. Data in the second set of latches and the third set of latches are converted during the programming of the upper page data to preserve the upper page data within a combination of the second set of latches and the third set of latches. A program error is detected while programming the upper page data. The upper page data is recovered in response to detecting the program error. The recovering includes performing a logical operation on data in the second set of latches and the third set of latches.

Generally, architectures that program all bit lines together will read data from all bit lines together. Similarly, architectures that program odd and even bit lines separately will generally read odd and even bit lines separately. However, such limitations are not required. The technology described herein for reading data can be used with all bit line programming or odd/even bit line programming. The technology described herein for reading data can also be used for other programming schemes.

The foregoing detailed description has been presented for purposes of illustration and description. It is not intended to be exhaustive or to limit embodiments to the precise form disclosed. Many modifications and variations are possible in light of the above teaching. The described embodiments were chosen in order to best explain principles and practical applications, to thereby enable others skilled in the art to best utilize various embodiments and with various modifications as are suited to the particular use contemplated. It is intended that the scope be defined by the claims appended hereto.

We claim:

1. A non-volatile storage device comprising:
a plurality of non-volatile storage elements;
a plurality of sets of latches, each set of latches is associated with one of the non-volatile storage elements, the set of latches associated with each non-volatile storage element includes a first latch, a second latch, and a third latch;
one or more managing circuits in communication with the plurality of non-volatile storage elements, and the plurality of sets of latches, the one or more managing circuits store a plurality of first bits into respective ones of the first latches, the one or more managing circuits store a plurality of second bits into respective ones of the second latches, the one or more managing circuits program the plurality of first bits and the plurality of second bits into the plurality of non-volatile storage elements, each of the non-volatile storage elements is to be programmed with one of the plurality of first bits and one of the plurality of second bits, the one or more managing circuits store verify status in the plurality of second latches and the plurality of third latches while programming the non-volatile storage elements, the one or more managing circuits preserve the plurality of second bits within a combination of the plurality of second latches and the plurality of third latches while using the plurality of second latches and the plurality of third latches for verify status, the one or more managing circuits recover the plurality of second bits in response to a program error during the programming based on data in at least the plurality of second latches.

2. The non-volatile storage device of claim 1, wherein the one or more managing circuits convert data in the plurality of second latches and the plurality of third latches during the programing to preserve the plurality of second bits within the combination of the plurality of second latches and the plurality of third latches.

3. The non-volatile storage device of claim 1, wherein the one or more managing circuits perform a logical operation on data in the plurality of second latches and the plurality of third latches to recover the plurality of second bits in response to the program error.

4. The non-volatile storage device of claim 1, wherein the one or more managing circuits restore the plurality of second bits to the plurality of second latches by performing a logical operation on data in the plurality of third latches prior to detecting the program error.

5. The non-volatile storage device of claim 4, wherein the one or more managing circuits read data from the plurality of second latches to recover the plurality of second bits in response to the program error.

6. The non-volatile storage device of claim 1, wherein the one or more managing circuits determine whether to recover the plurality of second bits based on a logical operation on data in the plurality of second latches and the plurality of third latches or by reading data directly from the plurality of second latches based on whether the program error occurred while preserving the plurality of second bits within the combination of the plurality of second latches and the plurality of third latches.

7. The non-volatile storage device of claim 4, wherein the one or more managing circuits:
release the plurality of first latches prior to completing the programming of the plurality of non-volatile storage elements.

8. The non-volatile storage device of claim 1, further comprising a three-dimensional memory array, wherein the three-dimensional memory array comprises the plurality of non-volatile storage elements.

9. A non-volatile storage device comprising:
a plurality of non-volatile storage elements arranged as NAND strings;
a plurality of sets of latches, each set of latches is associated with one of the non-volatile storage elements, the set of latches associated with each non-volatile storage element includes a first latch for receiving program data, a second latch for receiving program data, and a third latch for storing verify status;
one or more managing circuits in communication with the plurality of non-volatile storage elements and the plurality of sets of latches, the one or more managing circuits store lower page data in the first latches, the one or more managing circuits store upper page data in the second latches, the one or more managing circuits program the lower page data and the upper page data into the plurality of non-volatile storage elements, the one or more managing circuits record verify status in the second latches and the third latches while programming the upper page data, the one or more managing circuits preserve the upper page data within a combination of the second latches and the third latches while using the second latches and the third latches for verify status, the one or more managing circuits perform a logical operation on data in the second latches and the third latches to recover the upper page data in response to a program error when programming the upper page data.

10. The non-volatile storage device of claim 9, further comprising a three-dimensional memory array, wherein the three-dimensional memory array comprises the plurality of non-volatile storage elements arranged as NAND strings.

11. A method for operating non-volatile storage, comprising:
- storing a plurality of first bits into a corresponding plurality of first latches;
- storing a plurality of second bits into a corresponding plurality of second latches;
- programming the plurality of first bits and the plurality of second bits into a plurality of non-volatile storage elements, each of the non-volatile storage elements is to be programmed with one of the plurality of first bits and one of the plurality of second bits;
- using the plurality of second latches and a plurality of third latches for verify status when programming the non-volatile storage elements;
- preserving the plurality of second bits within a combination of the plurality of second latches and the plurality of third latches while using the plurality of second latches and the plurality of third latches for verify status; and
- recovering the plurality of second bits in response to a program error during the programming, the recovering is based on data in at least the plurality of second latches.

12. The method of claim 11, wherein the preserving the plurality of second bits within the combination of the plurality of second latches and the plurality of third latches includes:
- converting data in the plurality of second latches and the plurality of third latches during the programming to preserve the plurality of second bits within the combination of the plurality of second latches and the plurality of third latches.

13. The method of claim 11, wherein the recovering the plurality of second bits in response to a program error includes:
- performing a logical operation on data in the plurality of second latches and the plurality of third latches.

14. The method of claim 11, further comprising:
- restoring the plurality of second bits to the plurality of second latches by performing a logical operation on data in the plurality of third latches prior to detecting the program error.

15. The method of claim 14, wherein the recovering the plurality of second bits in response to a program error includes:
- reading data from the plurality of second latches.

16. The method of claim 11, wherein the recovering the plurality of second bits in response to the program error during the programming includes:
- determining whether to recover the plurality of second bits based on a logical operation on data in the plurality of second latches and the plurality of third latches or by reading data directly from the plurality of second latches based on whether the program error occurred while preserving the plurality of second bits within the combination of the plurality of second latches and the plurality of third latches.

17. The method of claim 11, further comprising:
- releasing the plurality of first latches, the first latches are free while preserving the plurality of second bits within the combination of the plurality of second latches and the plurality of third latches.

18. The method of claim 11, wherein the plurality of non-volatile storage elements are part of a three-dimensional memory array.

19. A method for operating non-volatile storage, comprising:
- storing lower page data in a first set of latches;
- storing upper page data in a second set of latches;
- programming the lower page data and the upper page data into a plurality of non-volatile storage elements;
- using the second set of latches and a third set of latches for verify status while programming the upper page data;
- preserving the upper page data within a combination of the second set of latches and the third set of latches while using the second set of latches and a third set of latches for verify status;
- detecting a program error while programming the upper page data; and
- recovering the upper page data in response to detecting the program error, the recovering including performing a logical operation on data in the second set of latches and the third set of latches if the upper page data is being preserved within the combination of the second set of latches and the third set of latches when the program error was detected and reading the upper page from the second set of latches if the upper page data is being stored in the second set of latches when the program error was detected.

20. The method of claim 19, wherein the non-volatile storage elements are programmed to a plurality of states, the preserving the upper page data within the combination of the second set of latches and the third set of latches includes:
- modifying data in both the second set of latches and the third set of latches upon completion of programming a first state (C-state) of the plurality of states, but prior to starting programming of a second state (A-state) of the plurality of states.

21. The method of claim 19, further comprising:
- restoring the upper page data to the second set of latches by performing a logical operation on data in the plurality of third latches prior to detecting the program error.

22. The method of claim 19, wherein the preserving the upper page data within the combination of the second set of latches and the third set of latches includes:
- modifying data in the third set of latches based on a logical combination of data in the second set of latches and the third set of latches.

23. The method of claim 22, wherein the preserving the upper page data within the combination of the second set of latches and the third set of latches further includes:
- modifying data in the second set of latches based on a logical combination of data in the second set of latches and modified data in the third set of latches.

24. The method of claim 19, further comprising:
- releasing the first set of latches prior to completing the programming a plurality of non-volatile storage elements, the first set of latches are free while preserving the upper page data within the combination of the second set of latches and the third set of latches.

25. The method of claim 19, wherein the plurality of non-volatile storage elements are arranged as NAND strings.

26. The method of claim 19, wherein the plurality of non-volatile storage elements are part of a three-dimensional memory array.

27. A method for operating non-volatile storage, comprising:
- storing lower page data in a first set of latches associated with a plurality of non-volatile storage elements arranged as NAND strings, each of the non-volatile storage elements is associated with one of the latches in the first set;
- storing upper page data in a second set of latches, each of the non-volatile storage elements is associated with one of the latches in the second set;

initializing a third set of latches, each of the non-volatile storage elements is associated with one of the latches in the third set;

programming the lower page data and the upper page data into the plurality of non-volatile storage elements, the programming including programming to an A-state, a B-state, and a C-state, the programming of the B-state and the C-state is completed prior to starting to program the A-state;

using the second set of latches and a third set of latches for verify status at least while programming the upper page data;

converting data in the second set of latches and the third set of latches during the programming of the upper page data to preserve the upper page data within a combination of the second set of latches and the third set of latches;

detecting a program error while programming the upper page data; and recovering the upper page data in response to detecting the program error, the recovering including performing a logical operation on data in the second set of latches and the third set of latches.

28. The method of claim 27, wherein the converting data in the second set of latches and the third set of latches during the programming of the upper page data to preserve the upper page data within the combination of the second set of latches and the third set of latches includes:

converting data in the second set of latches and the third set of latches after programming the B-state and the C-state completes, but prior to starting programming the A-state.

29. The method of claim 27, further comprising:

releasing the first set of latches after programming the B-state and the C-state is complete, but prior to starting to program the A-state.

30. The method of claim 27, further comprising:

recovering the lower page data in response to detecting the program error, the recovering the lower page data including reading data from the non-volatile storage elements.

31. The method of claim 27, wherein the plurality of non-volatile storage elements arranged as NAND strings are part of a three-dimensional memory array.

* * * * *